(12) United States Patent
Do

(10) Patent No.: US 11,133,412 B2
(45) Date of Patent: *Sep. 28, 2021

(54) INTEGRATED CIRCUIT DEVICES INCLUDING VERTICAL FIELD-EFFECT TRANSISTORS (VFETS)

(71) Applicant: Samsung Electronics Co., Ltd., Suwon-si (KR)

(72) Inventor: Jung Ho Do, Hwaseong-si (KR)

(73) Assignee: Samsung Electronics Co., Ltd.

( * ) Notice: Subject to any disclaimer, the term of this patent is extended or adjusted under 35 U.S.C. 154(b) by 61 days.

This patent is subject to a terminal disclaimer.

(21) Appl. No.: 16/540,090

(22) Filed: Aug. 14, 2019

(65) Prior Publication Data

US 2020/0144418 A1 May 7, 2020

Related U.S. Application Data

(60) Provisional application No. 62/755,664, filed on Nov. 5, 2018.

(51) Int. Cl.
| | |
|---|---|
| *H01L 29/78* | (2006.01) |
| *H02M 7/537* | (2006.01) |
| *H01L 27/02* | (2006.01) |
| *H01L 23/522* | (2006.01) |

(52) U.S. Cl.
CPC ...... *H01L 29/7827* (2013.01); *H01L 23/5226* (2013.01); *H01L 27/0207* (2013.01); *H02M 7/537* (2013.01)

(58) Field of Classification Search
CPC ......... H01L 29/7827; H01L 21/823885; H01L 21/823871; H01L 23/5226; H01L 27/092; H01L 27/0207
See application file for complete search history.

(56) References Cited

U.S. PATENT DOCUMENTS

| | | | |
|---|---|---|---|
| 9,818,651 B2 | 11/2017 | Bouche et al. | |
| 9,892,224 B2 | 2/2018 | Lin et al. | |
| 9,954,529 B2 | 4/2018 | Anderson et al. | |
| 9,985,014 B2 | 5/2018 | Xu et al. | |
| 10,056,377 B2 | 8/2018 | Bentley et al. | |
| 2018/0012993 A1 | 1/2018 | Cheng et al. | |
| 2018/0097111 A1* | 4/2018 | Zhu | H01L 21/2253 |
| 2018/0175024 A1 | 6/2018 | Do et al. | |
| 2018/0190670 A1 | 7/2018 | Ryckaert et al. | |
| 2018/0197788 A1 | 7/2018 | Anderson et al. | |
| 2020/0144260 A1* | 5/2020 | Do | H01L 21/823871 |

* cited by examiner

*Primary Examiner* — Jose R Diaz
(74) *Attorney, Agent, or Firm* — Myers Bigel, P.A.

(57) ABSTRACT

Integrated circuit devices including standard cells are provided. The standard cells may include a P-type vertical field effect transistor (VFET) including a first channel region and a first top source/drain region sequentially stacked on a substrate in a vertical direction, an N-type VFET including a second channel region and a second top source/drain region sequentially stacked on the substrate in the vertical direction, and a top contact layer contacting both the first top source/drain region and the second top source/drain region.

20 Claims, 44 Drawing Sheets

INTEGRATED CIRCUIT DEVICES INCLUDING VERTICAL FIELD-EFFECT TRANSISTORS (VFETS)

CROSS-REFERENCE TO RELATED APPLICATION

This application claims priority to U.S. Provisional Application Ser. No. 62/755,664, entitled VFET HIGH DENSITY STANDARD CELL DESIGN, filed in the USPTO on Nov. 5, 2018, the disclosure of which is hereby incorporated by reference herein in its entirety.

FIELD

The present disclosure generally relates to the field of electronics and, more particularly, to vertical field-effect transistor (VFET) devices.

BACKGROUND

VFET devices have been researched because of their high scalability. Further, interconnections between VFETs may be simpler than those between planar transistors.

SUMMARY

According to some embodiments of the present inventive concept, integrated circuit devices may include standard cells may include a P-type vertical field effect transistor (VFET) including a first channel region and a first top source/drain region sequentially stacked on a substrate in a vertical direction, an N-type VFET including a second channel region and a second top source/drain region sequentially stacked on the substrate in the vertical direction, and a top contact layer contacting both the first top source/drain region and the second top source/drain region.

According to some embodiments of the present inventive concept, integrated circuit devices may include standard cells may include a P-type vertical field effect transistor (VFET) including a first channel region and a first top source/drain region sequentially stacked on a substrate in a vertical direction and an N-type VFET including a second channel region and a second top source/drain region sequentially stacked on the substrate in the vertical direction. The P-type VFET may be spaced apart from the N-type VFET in a first horizontal direction that is perpendicular to the vertical direction. The standard cells may also include a common gate layer including a first portion that may be included in a first gate electrode of the P-type VFET and a second portion that may be included in a second gate electrode of the N-type VFET. The standard cells may further include first and second conductive lines on the common gate layer, and first and second via contacts between the first and second conductive lines and the common gate layer. The first and second top source/drain regions may be electrically connected to the first conductive line through the first via contact, and the common gate layer may be electrically connected to the second conductive line through the second via contact. The first via contact and the second via contact may be spaced apart from each other in a second horizontal direction that is perpendicular to both the first horizontal direction and the vertical direction and may be arranged along the second horizontal direction.

DETAILED DESCRIPTION

According to some embodiments of the present inventive concept, a standard cell may include at least two VFETs having different conductive types.

Figure 1:
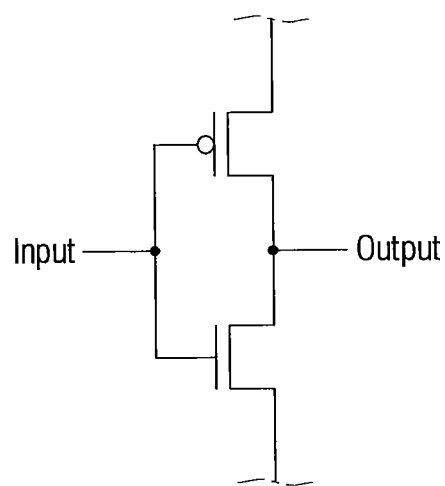
FIG. 1 is a circuit diagram of a portion of a standard cell, according to some embodiments.

FIG. 1 is a circuit diagram of a portion of a standard cell, according to some embodiments.

Referring to FIG. 1, a portion of a standard cell, which includes one P-type VFET and one N-type VFET, which share a single output and a single input. For example, the standard cell may be one of an inverter, a 2-input NAND gate, a 3-input NAND gate, a 2-input NOR, a 3-input NOR, an And-Or inverter (AOI), an Or-And inverter (OAI), an XNOR gate, an XOR gate, a multiplexer (MUX), a latch, and a D-flip-flop.

Figure 2:
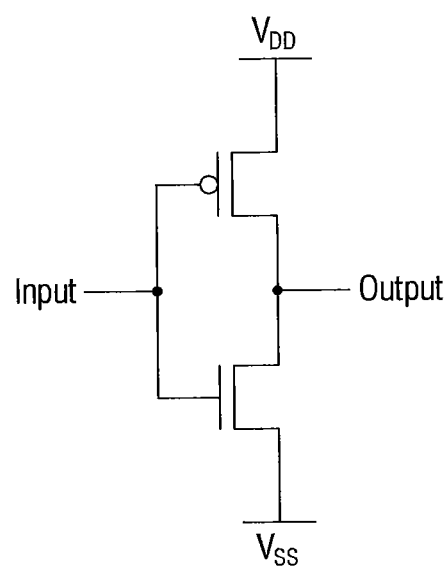
FIG. 2 is a circuit diagram of an inverter, according to some embodiments.

FIG. 2 is a circuit diagram of an inverter, according to some embodiments.

Referring to FIG. 2, a drain voltage $V_{DD}$ may be applied to the P-type VFET, and a source voltage $V_{SS}$ may be applied to the N-type VFET.

Figure 3A:
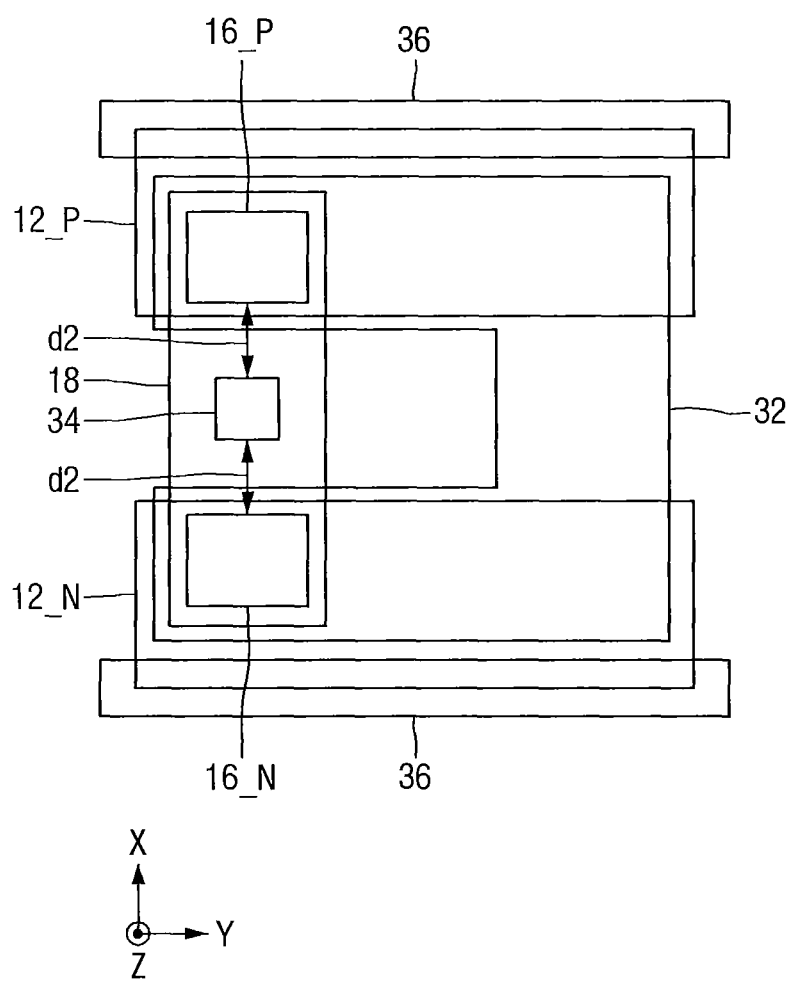
FIGS. 3A and 3B show layouts of the inverter of FIG. 2, according to some embodiments.
Figure 3B:
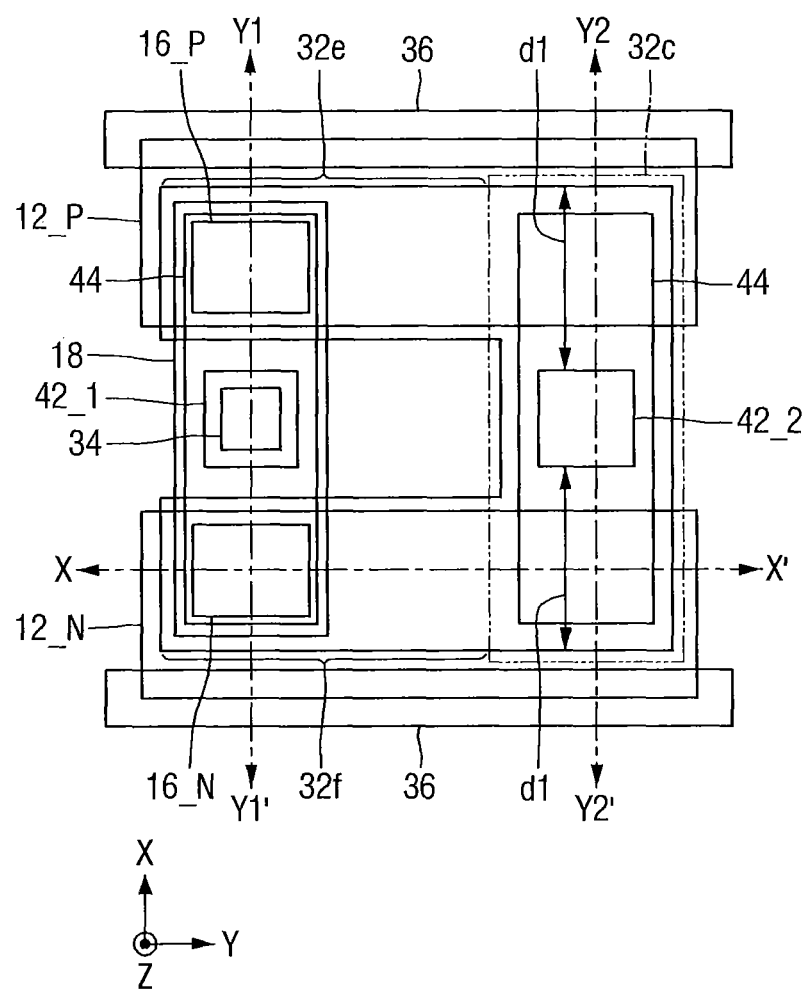

FIGS. 3A and 3B show layouts of the inverter of FIG. 2 according to some embodiments.

Referring to FIGS. 3A and 3B, the layouts of the same region of the inverter are shown, and each of FIGS. 3A and 3B shows a group of elements, rather than all elements, to simplify drawings.

Figure 4A:
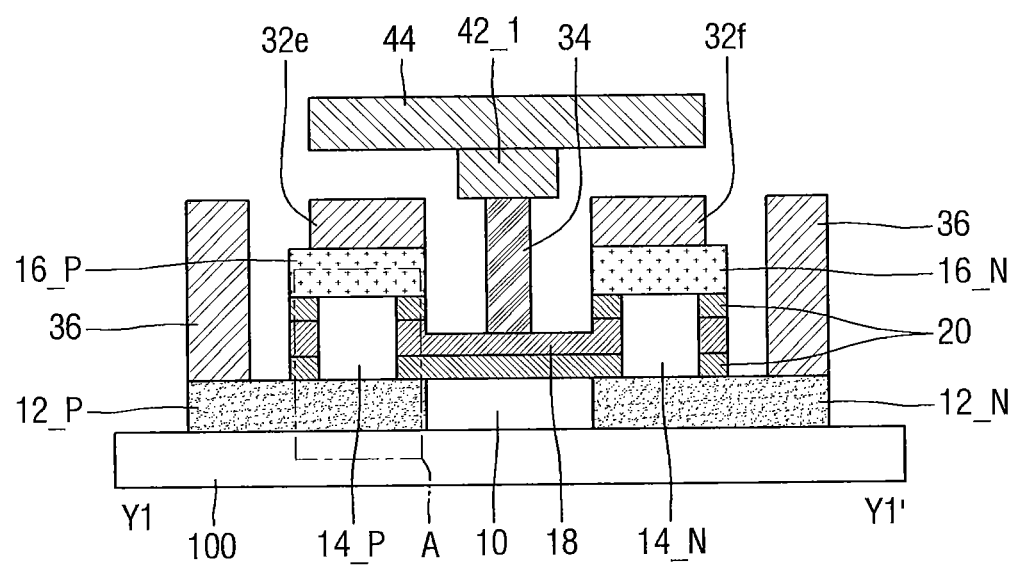
FIGS. 4A, 4B, and 4C are cross-sectional views taken along the lines Y1-Y1', Y2-Y2', and X-X' of FIG. 3B, respectively, according to some embodiments.
Figure 4B:
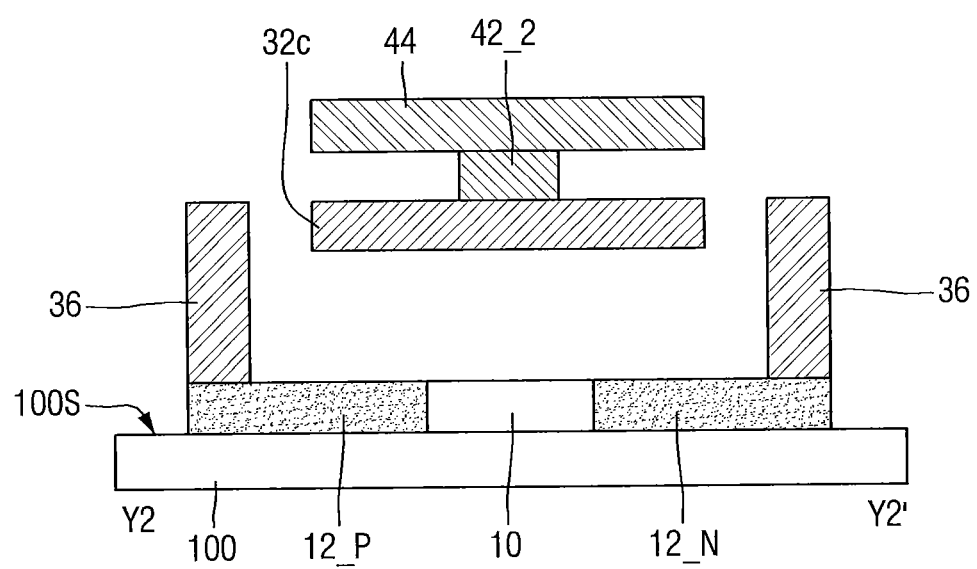
Figure 4C:
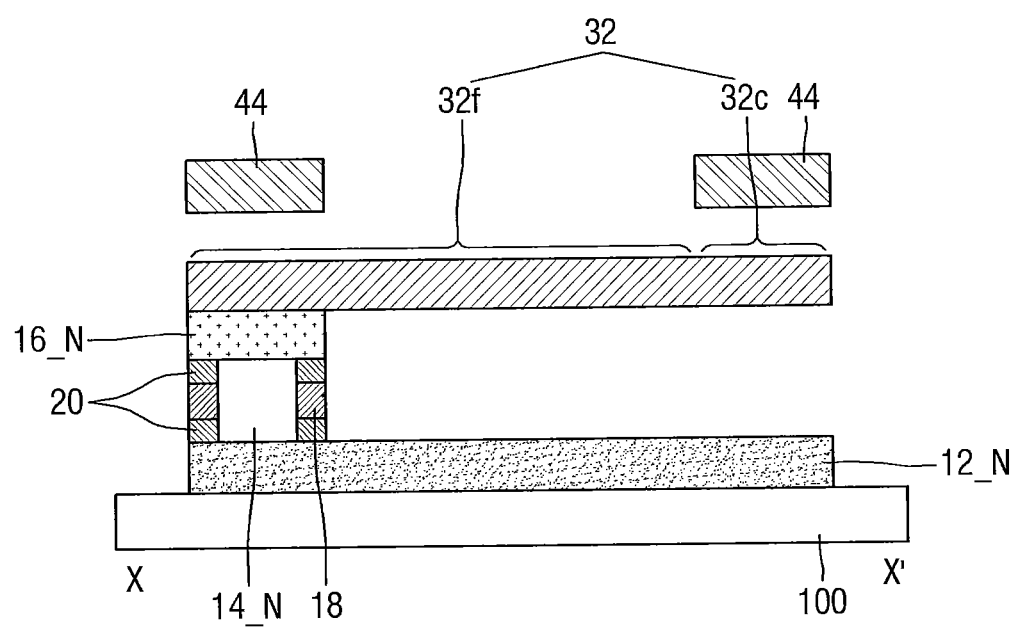
Figure 4D:
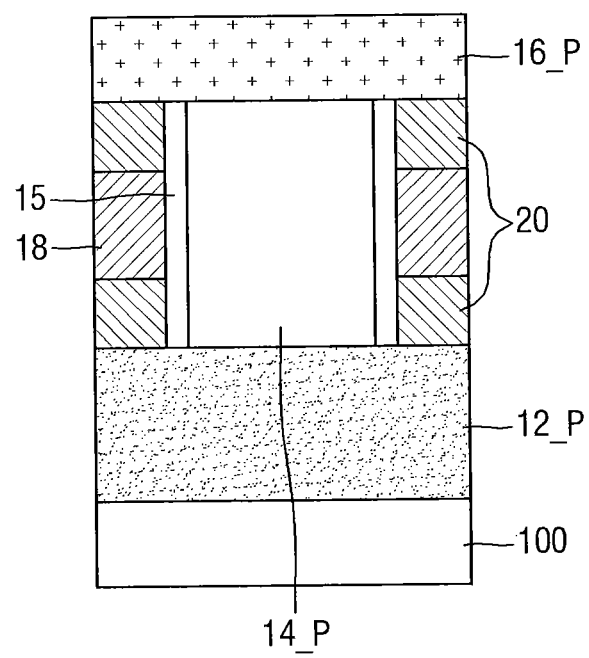
FIGS. 4D and 4E are enlarged views of the region A of FIG. 4A, according to some embodiments.
Figure 4E:
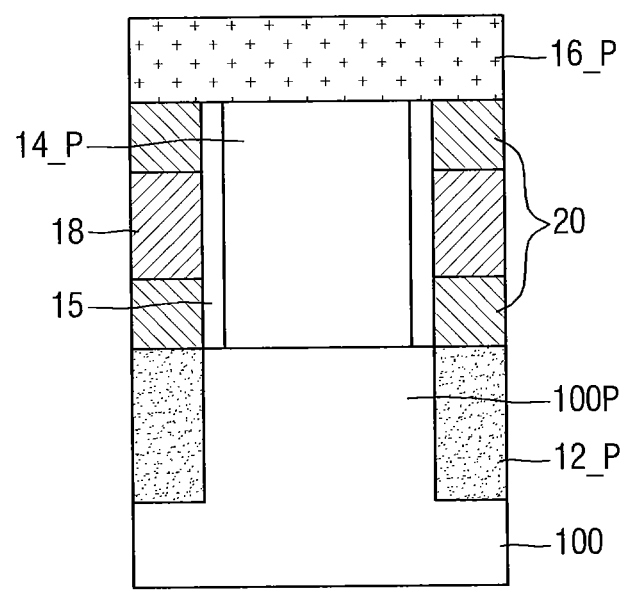

FIGS. 4A, 4B, and 4C are cross-sectional views taken along the lines Y1-Y1', Y2-Y2', and X-X' of FIG. 3B, respectively, according to some embodiments. FIGS. 4D and 4E are enlarged views of the region A of FIG. 4A, according to some embodiments.

Referring to FIGS. 3A through 4C, the inverter may include a P-type VFET and an N-type VFET. The P-type VFET may include a first bottom source/drain region 12_P, a first channel region 14_P, a first top source/drain region 16_P, and the N-type VFET may include a second bottom source/drain region 12_N, a second channel region 14_N, a second top source/drain region 16_N. The first channel region 14_P and the first top source/drain region 16_P may be sequentially stacked on a substrate 100 in a vertical direction Z, and the second channel region 14_N and the second top source/drain region 16_N may be sequentially stacked on the substrate 100 in the vertical direction Z. The vertical direction Z may be perpendicular to a surface 100S of the substrate 100. In some embodiments, the P-type VFET and the N-type VFET may be spaced part from each other in a first horizontal direction X that may be perpendicular to the vertical direction Z.

The inverter may include a common gate layer 18. A portion of the common gate layer 18 may be a gate electrode of the P-type VFET and a portion of the common gate layer 18 may be a gate electrode of the N-type VFET. As the P-type VFET and the N-type VFET share the common gate layer 18, the same input may be applied to the P-type VFET and the N-type VFET as a gate input. Spacers 20 may be provided to electrically isolate the common gate layer 18 from the first and second bottom source/drain regions 12_P and 12_N and from the first and second top source/drain regions 16_P and 16_N. The first and second bottom source/drain regions 12_P and 12_N may be electrically isolated from each other by an isolation layer 10 (e.g., a shallow trench isolation layer).

A top contact layer 32 may be on the P-type VFET and the N-type VFET and may contact both the first top source/drain region 16_P and the second top source/drain region 16_N. The top contact layer 32 may include a connecting portion 32c that may extend longitudinally in the first horizontal direction X, a first extending portion 32e protruding from the connecting portion 32c toward the first top source/drain regions 16_P, and a second extending portion 32f protruding from the connecting portion 32c toward the second top source/drain regions 16_N as shown in FIGS. 3B and 4C. The first and second extending portions 32e, 32f may extend longitudinally in a second horizontal direction Y that may be perpendicular to both the first horizontal direction X and the vertical direction Z and may contact the first and second top source/drain regions 16_P and 16_N, respectively. The top contact layer 32 may include metal, for example, cobalt (Co), tungsten (W), and/or copper (Cu). The first top source/drain region 16_P and the second top source/drain region 16_N may be electrically connected to each other through the top contact layer 32.

A first via contact 42_2 and a conductive line 44 may be sequentially stacked on the top contact layer 32. In some embodiments, the first via contact 42_2 may contact the connecting portion 32c of the top contact layer 32, and the conductive line 44 may contact the first via contact 42_2, as illustrated in FIG. 4B. In some embodiments, the top contact layer 32 may be connected to an output node of the inverter through the first via contact 42_2 and the conductive line 44. Each of the first via contact 42_2 and the conductive line 44 may include metal, for example, copper and/or cobalt. In some embodiments, the conductive line 44 may be a metal line that is closest to the substrate 100 in the vertical direction Z and may be referred to as a first metal line used for routing.

Referring to FIG. 3B, in some embodiments, the conductive line 44 may extend longitudinally in the first horizontal direction X. In some embodiments, the first via contact 42 may be spaced apart from each of opposing sides of the connecting portion 32c of the top contact layer 32, which are spaced apart from each other in the first horizontal direction X, by a first distance d1 in the first horizontal direction X and thus may be equidistant from each of the opposing sides of the connecting portion 32c of the top contact layer 32.

A gate contact 34 may contact the common gate layer 18. In some embodiments, a portion of the common gate layer 18 may be exposed by the spacer 20 and may be contacted by the gate contact 34, as illustrated in FIG. 4A. The gate contact 34 may include metal, for example, Co, W, and/or Cu. In some embodiments, the gate contact 34 may be spaced apart from each of the first top source/drain region 16_P and the second top source/drain region 16_N in the first horizontal direction X by a second distance d2 and thus may be equidistant from the first top source/drain region 16_P and the second top source/drain region 16_N, as illustrated in FIG. 3A.

A second via contact 42_1 and a conductive line 44 may be sequentially stacked on the gate contact 34, as illustrated in FIG. 4A. In some embodiments, the second via contact 42_1 may contact the gate contact 34, and the conductive line 44 may contact the second via contact 42_1, as illustrated in FIG. 4A. In some embodiments, an input of the inverter may be applied to the common gate layer 18 through the conductive line 44, the second via contact 42_1, and the gate contact 34.

In some embodiments, the inverter may include first and second bottom contacts 36 as illustrated in FIG. 3A. The first bottom contact 36 may contact the first bottom source/drain region 12_P, and the second bottom contact 36 may contact the second bottom source/drain region 12_N, as illustrated in FIGS. 4A and 4B. In some embodiments, a first power having a first voltage (e.g., a drain voltage $V_{DD}$) may be applied to the first bottom source/drain region 12_P through the first bottom contact 36, and a second power having a second voltage (e.g., a source voltage $V_{SS}$) may be applied to the second bottom source/drain region 12_N through the second bottom contact 36. For example, the first and second bottom contacts 36 may include metal, for example, Co, W, and/or Cu.

Referring to FIGS. 4D and 4E, a gate insulator 15 may be disposed between the first channel region 14_P and the common gate layer 18 to electrically isolate the first channel region 14_P and the common gate layer 18. Although FIGS. 4D and 4E show that the gate insulator 15 is also between the spacer 20 and the first channel region 14_P, it will be understood that the gate insulator 15 can be omitted between the spacer 20 and the first channel region 14_P, and the spacer 20 may contact the first channel region 14_P. In some embodiments, a lower surface of the first channel region 14_P may overlap the first bottom source/drain region 12_P, as illustrated in FIG. 4D. In some embodiments, the lower surface of the first channel region 14_P may be connected to the substrate 100 through a protruding portion 100P of the substrate 100, and the first bottom source/drain region 12_P may be on a side of the protruding portion 100P of the substrate 100. Although only the P-type VFET is illustrated in FIGS. 4D and 4E, it will be understood that all VFETs including the N-type VFET in FIGS. 4A and 4C can have a structure the same as or similar to the P-type VFET.

Referring again to FIGS. 3A and 3B, in some embodiments, the first via contact 42_2 contacting the top contact layer 32 and the second via contact 42_1 contacting the gate contact 34 may be spaced apart from each other in the second horizontal direction Y and may be arranged along the second horizontal direction Y. The first and second via contacts 42_2, 42_1 may be aligned along the second horizontal direction Y.

Figure 5:
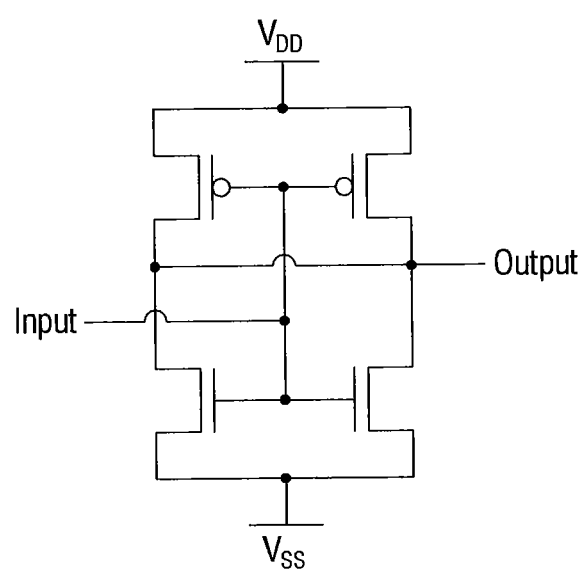
FIG. 5 is a circuit diagram of an inverter, according to some embodiments.

According to some embodiments, the standard cell may be an inverter shown in FIG. 5.

FIG. 5 is a circuit diagram of an inverter, according to some embodiments.

Referring to FIG. 5, in some embodiments, an inverter may include two P-type VFETs connected in parallel and two N-type VFETs connected in parallel for better performance (e.g., higher current) compared with an inverter including a single P-type VFET and a single N-type VFET (e.g., the inverter shown in FIG. 2).

Figure 6A:
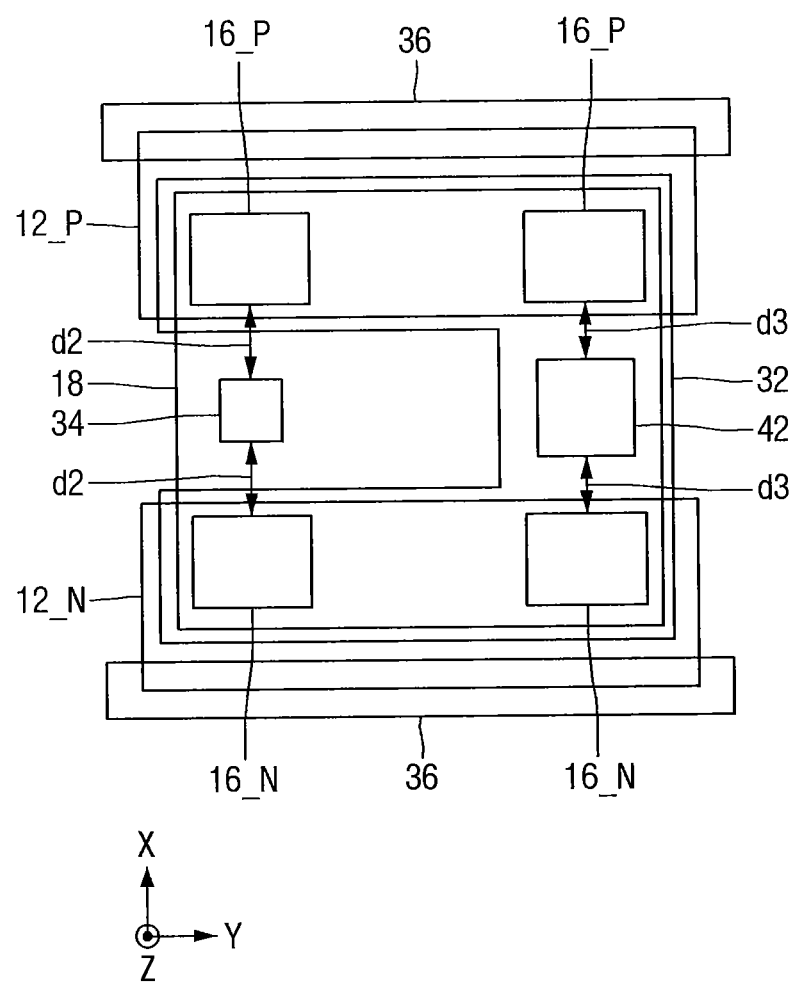
FIGS. 6A and 6B are layouts of the inverter of FIG. 5, according to some embodiments.
Figure 6B:
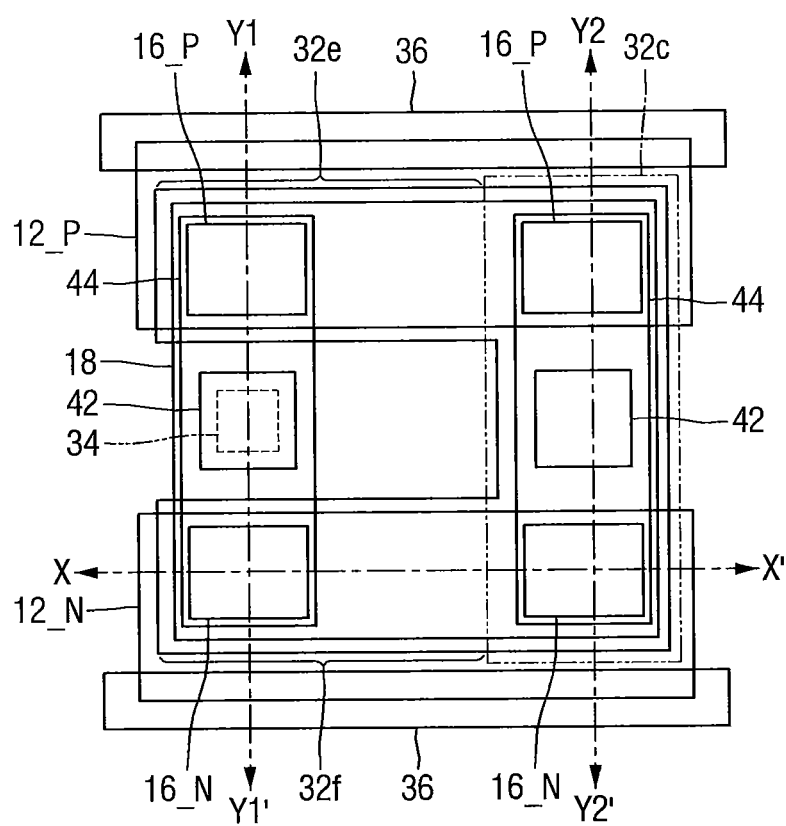

FIGS. 6A and 6B are layouts of the inverter of FIG. 5, according to some embodiments.

Each of FIGS. 6A and 6B shows a group of elements, rather than all elements, to simplify drawings. FIGS. 6A and 6B do not show some elements (e.g., the first and second bottom source/drain regions 12_P and 12_N in FIG. 3A) shown in FIGS. 3A and 3B to simplify drawings.

Figure 7A:
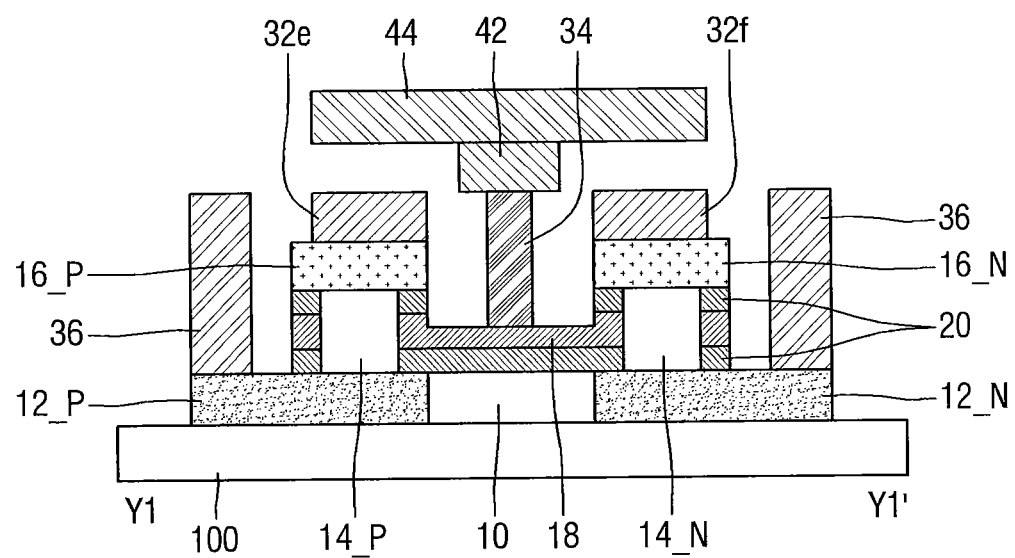
FIGS. 7A, 7B, and 7C are cross-sectional views taken along the lines Y1-Y1', Y2-Y2', and X-X' of FIG. 6B, respectively.
Figure 7B:
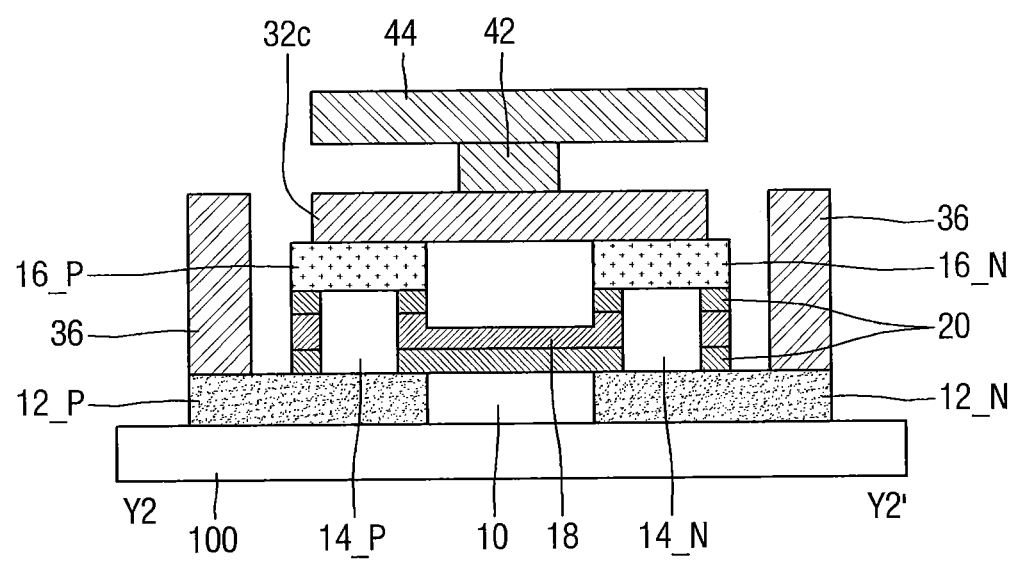
Figure 7C:
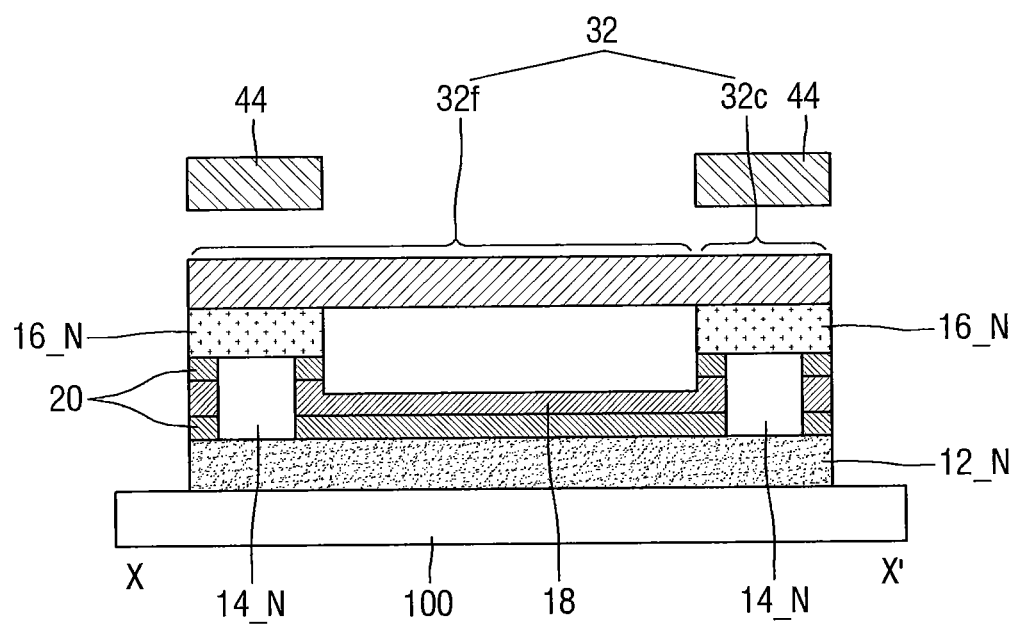

FIGS. 7A, 7B, and 7C are cross-sectional views taken along the lines Y1-Y1', Y2-Y2', and X-X' of FIG. 6B, respectively. It will be understood that FIG. 7A is the same as or similar to FIG. 4A.

Referring to FIG. 6A, in some embodiments, a first portion of the common gate layer 18 may be a gate electrode of a first one of the two P-type VFETs (i.e., a first P-type VFET), a second portion of the common gate layer 18 may be a gate electrode of a second one of the two P-type VFETs (i.e., a second P-type VFET), a third portion of the common gate layer 18 may be a gate electrode of a first one of the two N-type VFETs (i.e., a first N-type VFET), and a fourth portion of the common gate layer 18 may be a gate electrode of a second one of the two N-type VFETs (i.e., a second N-type VFET). As the two P-type VFETs and the two N-type VFETs share the common gate layer 18, the same input may be applied to the two P-type VFETs and the two N-type VFETs as a gate input.

In some embodiments, as illustrated in FIGS. 6A and 7B, the via contact 42 contacting the connecting portion 32c of the top contact layer 32 may be spaced apart from each of the first top source/drain region 16_P and the second top source/drain region 16_N in the first horizontal direction X by a third distance d3 and thus may be equidistant from the first top source/drain region 16_P and the second top source/drain region 16_N.

Referring to FIGS. 6A and 7A through 7C, the top contact layer 32 may contact two first top source/drain regions 16_P and two second top source/drain regions 16_N, and thus all of the two first top source/drain regions 16_P and the two second top source/drain regions 16_N may be electrically connected through the top contact layer 32.

Figure 8A:
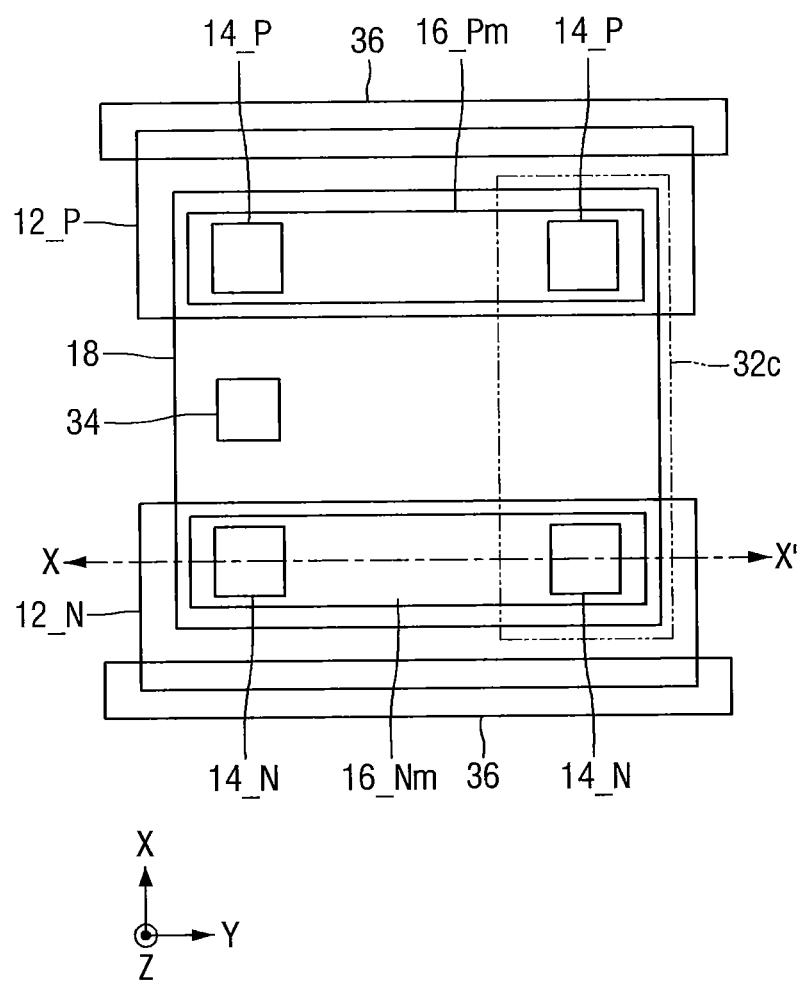
FIGS. 8A and 8B are layouts of the inverter of FIG. 5, according to some embodiments.
Figure 8B:
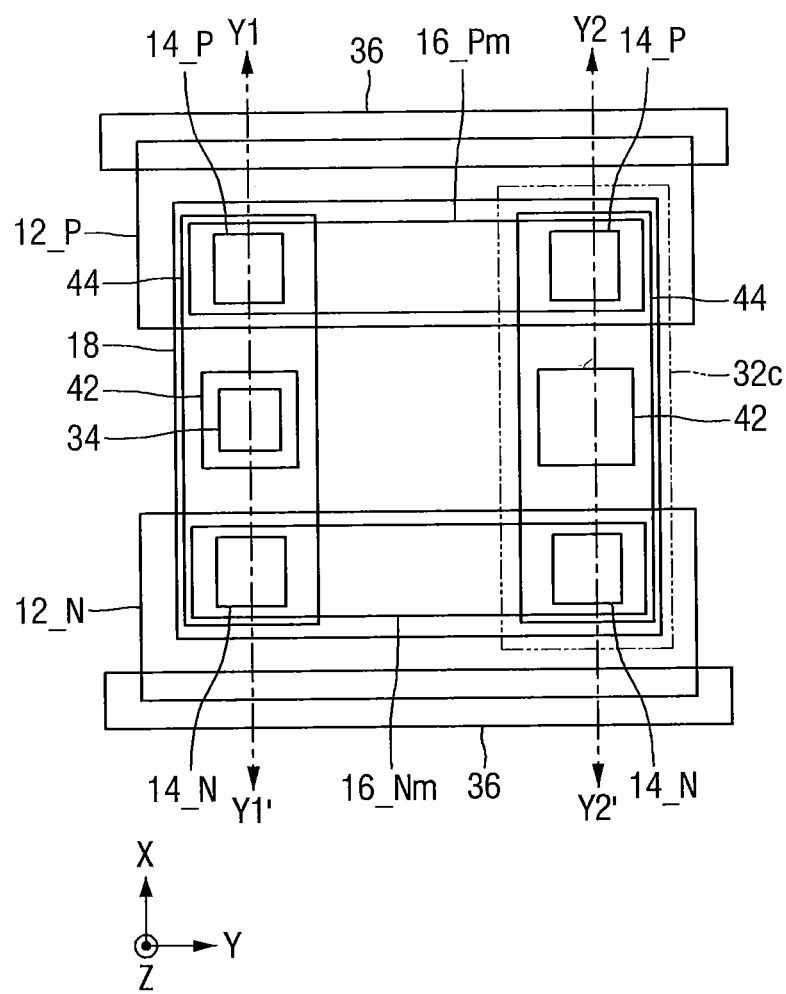

FIGS. 8A and 8B are layouts of the inverter of FIG. 5, according to some embodiments.

FIGS. 8A and 8B show the layouts of the same region of the inverter, and each of FIGS. 8A and 8B shows a group of elements, rather than all elements, to simplify drawings. FIGS. 8A and 8B do not show some elements (e.g., the first and second bottom source/drain regions 12_P and 12_N in FIG. 3A) shown in FIGS. 3A and 3B to simplify drawings.

Figure 9A:
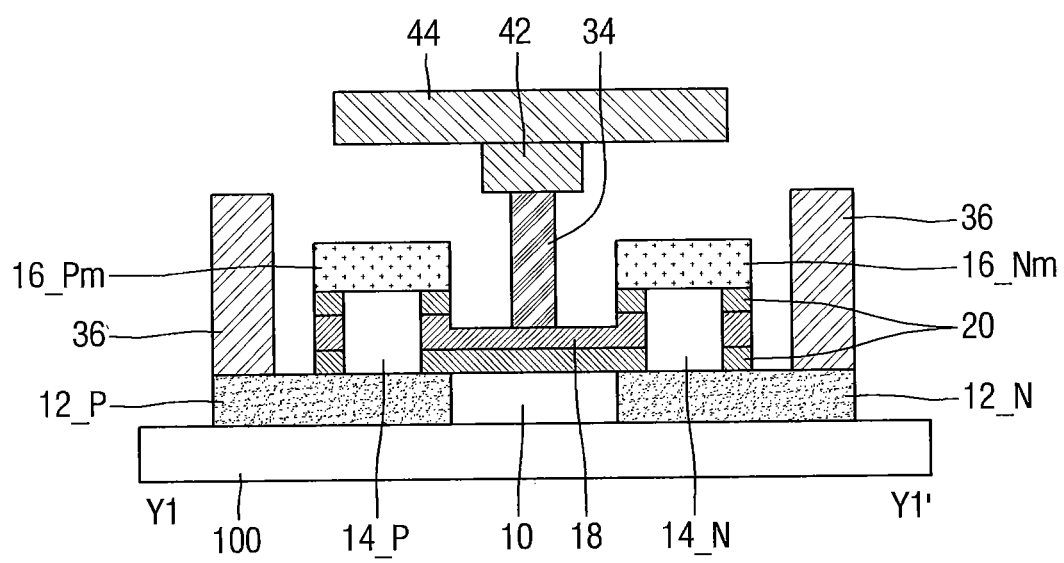
FIGS. 9A, 9B, and 9C are cross-sectional views taken along the lines Y1-Y1' of FIG. 8B, Y2-Y2' of FIG. 8B, and X-X' of FIG. 8A, respectively, according to some embodiments.
Figure 9B:
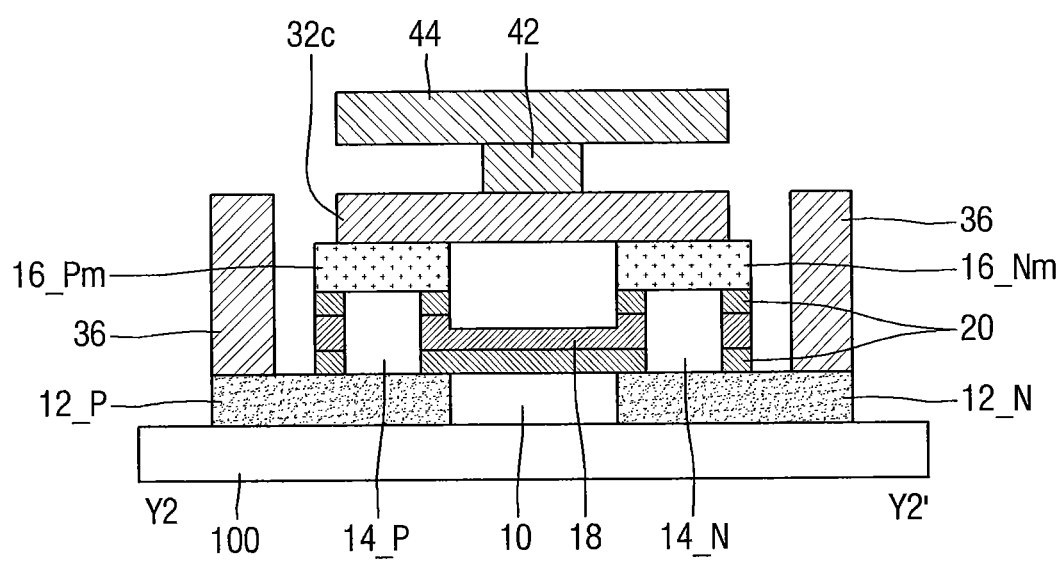
Figure 9C:
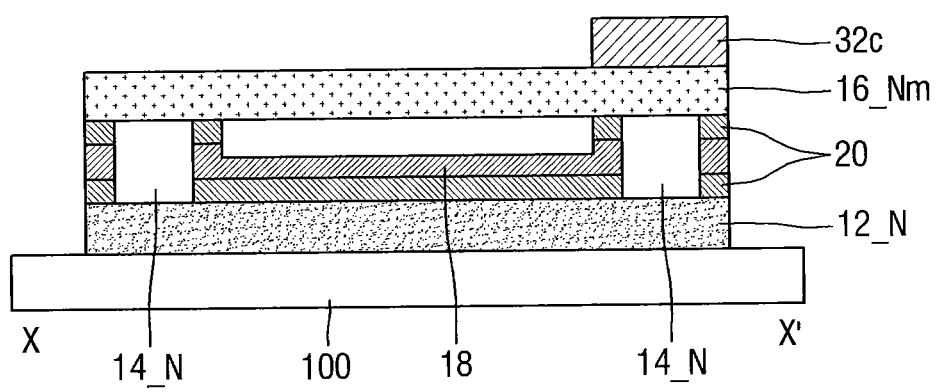

FIGS. 9A, 9B, and 9C are cross-sectional views taken along the lines Y1-Y1' of FIG. 8B, Y2-Y2' of FIG. 8B, and X-X' of FIG. 8A, respectively, according to some embodiments.

Referring to FIGS. 8A through 9C, the inverter may include a first merged top source/drain region 16_Pm and a second merged top source/drain region 16_Nm. The first merged top source/drain regions 16_Pm may contact two first channel regions 14_P that are spaced apart from each other in the second horizontal direction Y, and the second merged top source/drain regions 16_Nm may contact two second channel regions 14_N that are spaced apart from each other in the second horizontal direction Y.

In some embodiments, the top contact layer 32 may not include the extending portions 32e, 32f (e.g., the extending portions 32e, 32f in FIG. 3B) and may include only the connecting portion 32c. Referring to FIGS. 8A, 9A and 9C, in some embodiments, the top contact layer 32 (i.e., the connecting portion 32c of the top contact layer 32) may overlap only one of the two first channel regions 14_P and one of the two second channel regions 14_N.

Figure 10:
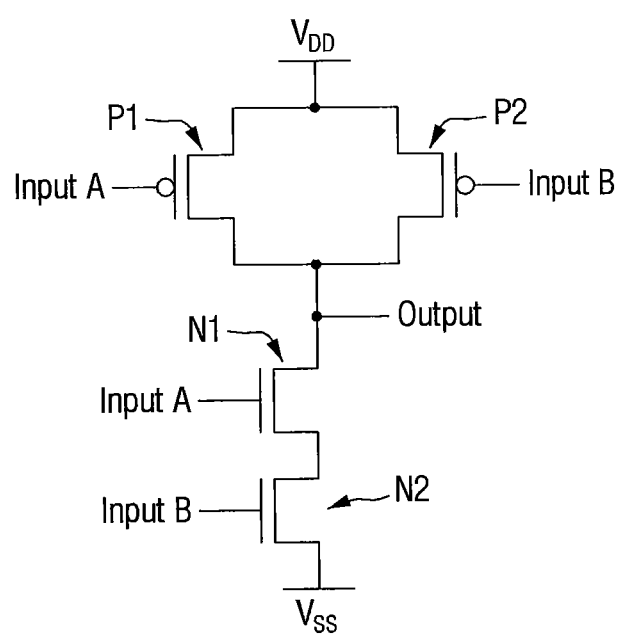
FIG. 10 is a circuit diagram of a 2-input NAND gate, according to some embodiments.

FIG. 10 is a circuit diagram of a 2-input NAND gate, according to some embodiments.

According to some embodiments, the standard cell may be a 2-input NAND gate shown in FIG. 10. The 2-input NAND gate of FIG. 10 may include a first P-type VFET P1 and a first N-type VFET N1 connected to each other the same as the circuit shown in FIG. 1. Specifically, the first P-type VFET P1 and the first N-type VFET N1 may share a first input (e.g., Input A) and an output (e.g., Output). The 2-input NAND gate may also include a second P-type VFET P2 and a second N-type VFET N2, which share a second input (e.g., Input B).

Figure 11A:
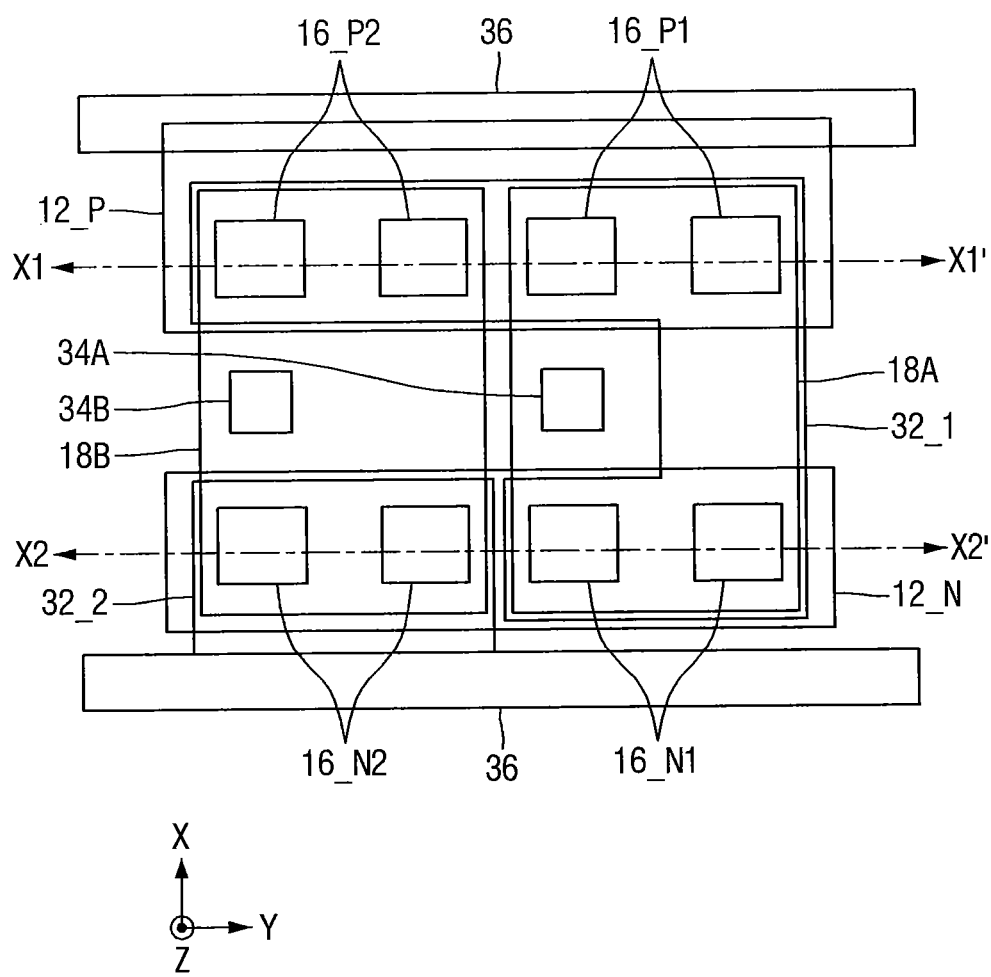
FIGS. 11A and 11B are layouts of the 2-input NAND gate of FIG. 10, according to some embodiments.
Figure 11B:
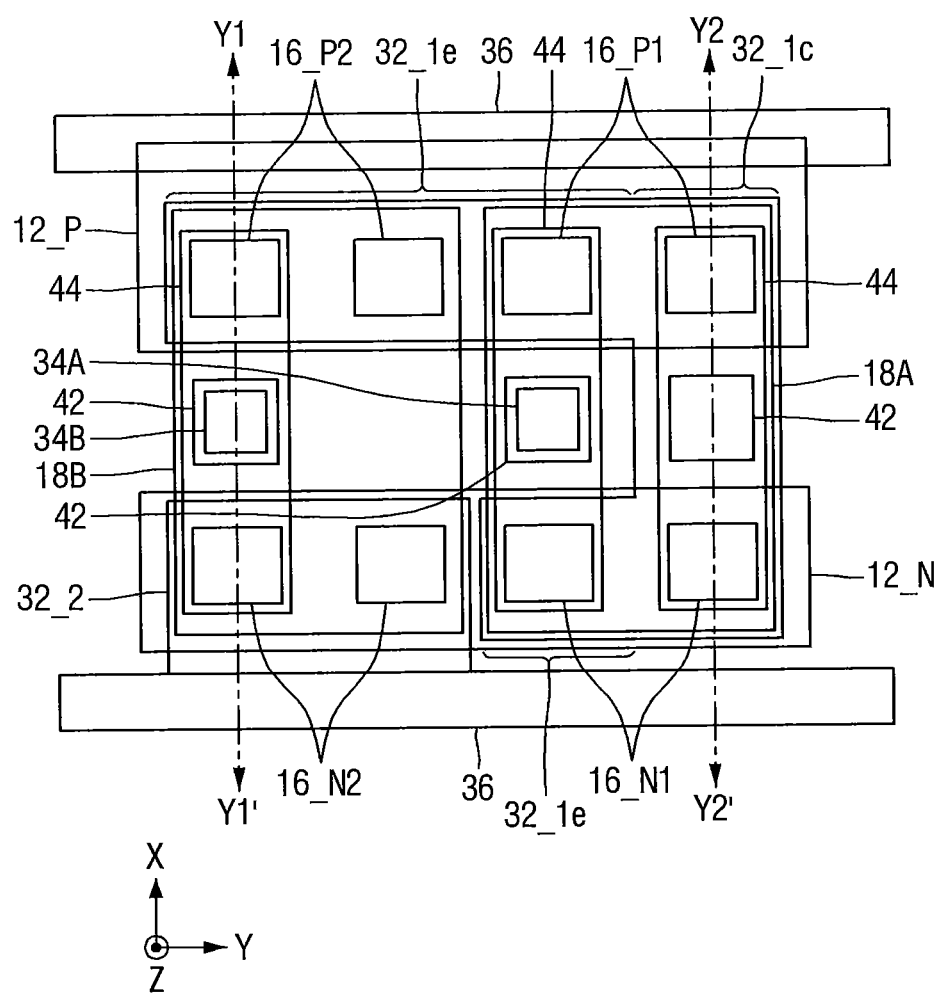

FIGS. 11A and 11B are layouts of the 2-input NAND gate of FIG. 10, according to some embodiments.

FIGS. 11A and 11B show the layouts of the same region of the 2-input NAND gate, and each of FIGS. 11A and 11B shows a group of elements, rather than all elements, to simplify drawings.

Figure 12A:
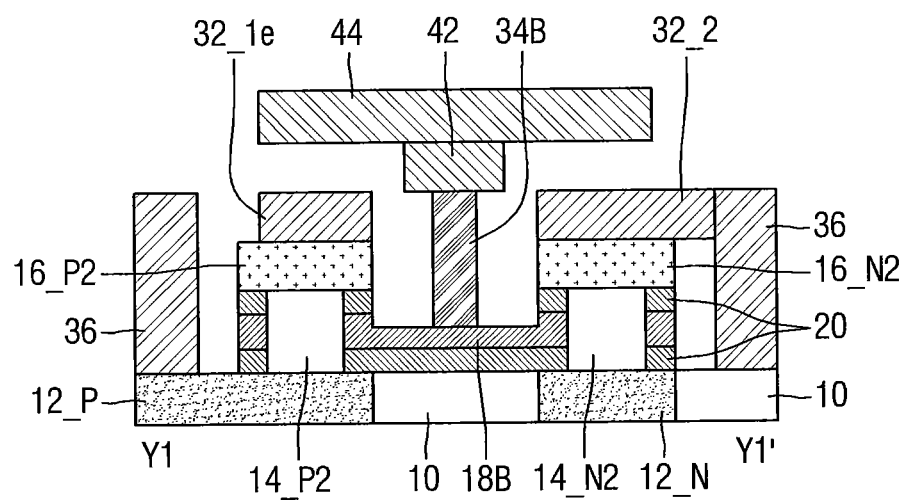
FIGS. 12A and 12B are cross-sectional views taken along the lines Y1-Y1' and Y2-Y2' of FIG. 11B, respectively.
Figure 12B:
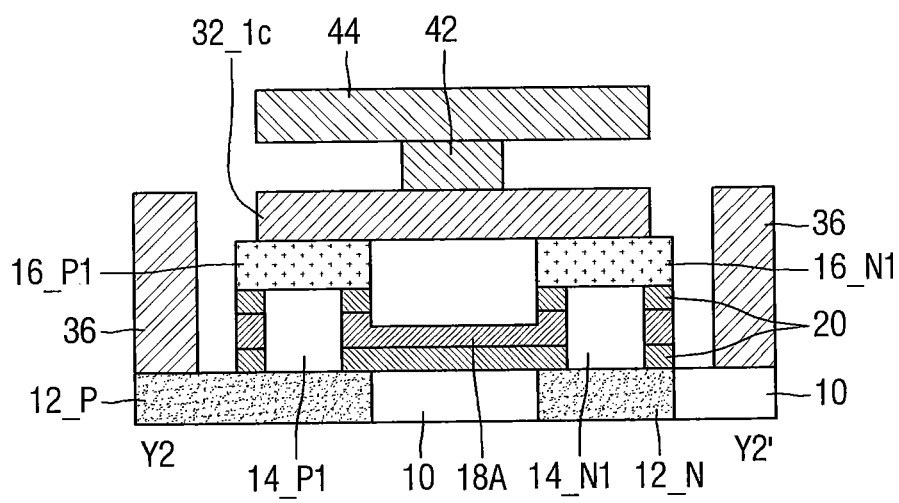
Figure 12C:
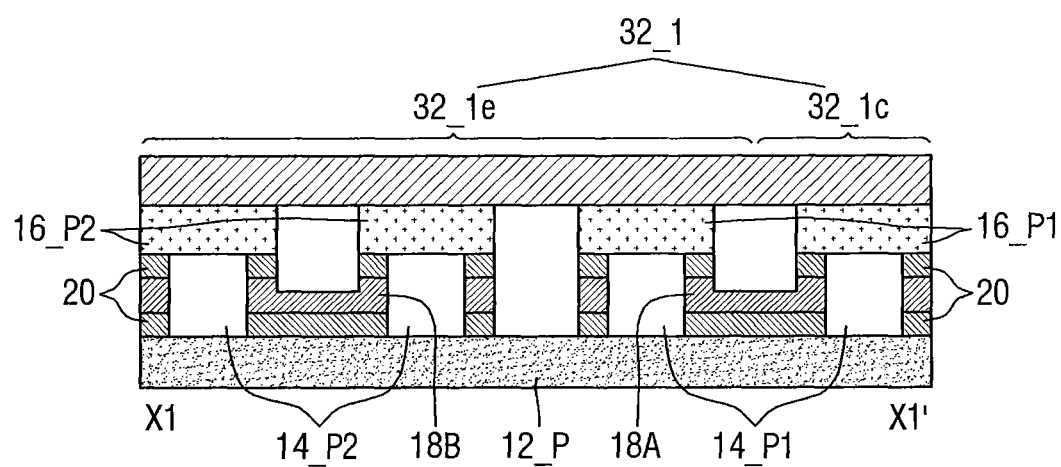
FIGS. 12C and 12D are cross-sectional views taken along the lines X1-X1' and X2-X2' of FIG. 11A, respectively.
Figure 12D:
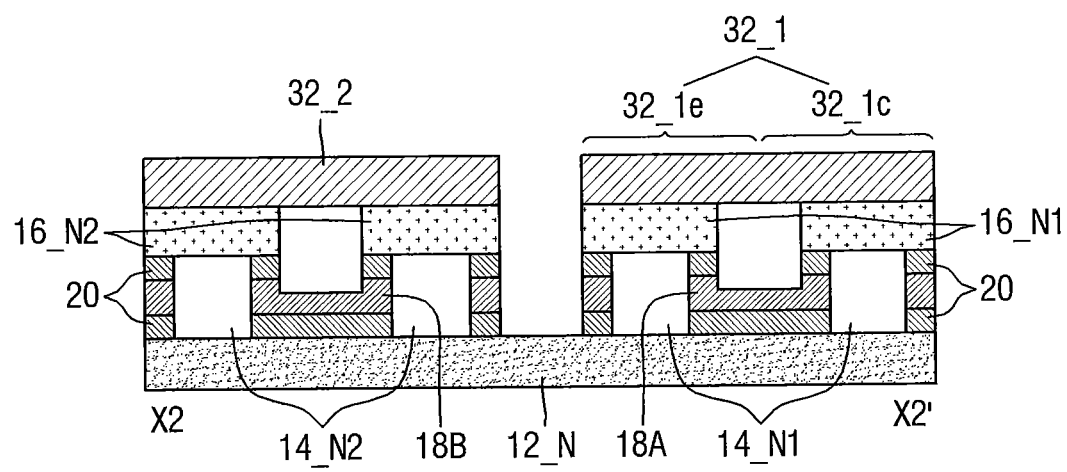

FIGS. 12A and 12B are cross-sectional views taken along the lines Y1-Y1' and Y2-Y2' of FIG. 11B, respectively, and FIGS. 12C and 12D are cross-sectional views taken along the lines X1-X1' and X2-X2' of FIG. 11A, respectively.

Although FIGS. 11A through 12D illustrate each of the transistors (i.e., the first P-type VFET P1, the first N-type VFET N1, the second P-type VFET P2, and the second N-type VFET N2) includes two transistors for better performance, it will be understood that each of the transistors may include a single transistor. To simplify drawings, the substrate 100 is not shown in FIGS. 12A through 12D.

Referring to FIGS. 11A through 12D, the first P-type VFET P1 may include two first P-type VFETs. Each of the two first P-type VFETs may include a first bottom source/drain region 12_P, a first channel region 14_P1, and a first top source/drain region 16_P1. The first N-type VFET N1 may include two first N-type VFETs. Each of the two first N-type VFETs may include a second bottom source/drain region 12_N, a second channel region 14_N1, and a second top source/drain region 16_N1. The second P-type VFET P2 may include two second P-type VFETs. Each of the two second P-type VFETs may include the first bottom source/drain region 12_P, a third channel region 14_P2, and a third top source/drain region 16_P2. The first bottom source/drain region 12_P may be shared by the two first P-type VFETs and the two second P-type VFETs. The second N-type VFET N2 may include two second N-type VFETs. Each of the two second N-type VFETs may include the second bottom source/drain region 12_N, a fourth channel region 14_N2, and a fourth top source/drain region 16_N2. The second bottom source/drain region 12_N may be shared by the two first N-type VFETs and the two second N-type VFETs.

The 2-input NAND gate may include a first common gate layer 18A. A first portion of the first common gate layer 18A may be a gate electrode of each of the two first P-type VFETs P1, and a second portion of the first common gate layer 18A may be a gate electrode of the two first N-type VFETs N1. As the two first P-type VFETs P1 and the two first N-type VFETs N1 share the first common gate layer 18A, the same input (e.g., Input A in FIG. 10) may be applied to the two first P-type VFETs P1 and the two first N-type VFETs N1 as a gate input. Spacers 20 may be provided to electrically isolate the first common gate layer 18A from the first and second bottom source/drain regions 12_P and 12_N and from the first and second top source/drain regions 16_P1 and 16_N1. The first and second bottom source/drain regions 12_P and 12_N may be electrically isolated from each other by an isolation layer 10 (e.g., a shallow trench isolation layer).

The 2-input NAND gate may also include a second common gate layer 18B. A first portion of the second common gate layer 18B may be a gate electrode of each of the two second P-type VFETs P2, and a second portion of the second common gate layer 18B may be a gate electrode of the two second N-type VFETs N2. As the two second P-type VFETs P2 and the two second N-type VFETs N2 share the second common gate layer 18B, the same input (e.g., Input B in FIG. 10) may be applied to the two second P-type VFETs P2 and the two second N-type VFETs N2 as a gate input. Spacers 20 may be provided to electrically isolate the second common gate layer 18B from the first and second bottom source/drain regions 12_P and 12_N and from the third and fourth top source/drain regions 16_P2 and 16_N2.

A first top contact layer 32_1 may extend on the two first P-type VFETs P1, the two first N-type VFETs N1, and the two second P-type VFETs P2. The first top contact layer 32_1 may contact and may electrically connect the two first top source/drain regions 16_P1, the two second top source/drain regions 16_N1, and the two third top source/drain regions 16_P2. The first top contact layer 32_1 may include a connecting portion 32_1c that may extend longitudinally in the first horizontal direction X and extending portions 32_1e protruding from the connecting portion 32_1c toward the two third top source/drain regions 16_P2 and the two second top source/drain regions 16_N1. Each of the extending portions 32_1e may extend longitudinally in the second horizontal direction Y. The first top contact layer 32_1 may include metal, for example, Co, W, and/or Cu. The first top contact layer 32_1 may not overlap and may be spaced apart from the two fourth top source/drain regions 16_N2, as illustrated in FIGS. 11B and 12D.

A second top contact layer 32_2 may extend on the two second N-type VFETs N2 and may contact the two fourth top source/drain regions 16_N2. In some embodiments, as illustrated in FIGS. 11A and 12A, the second top contact layer 32_2 may extend toward and contact the bottom contact 36 adjacent the two second N-type VFETs N2 such that a source voltage $V_{SS}$ may be applied to the two fourth top source/drain regions 16_N through the bottom contact 36 and the second top contact layer 32_2. The second top contact layer 32_2 may include metal, for example, Co, W, and/or Cu.

The 2-input NAND gate may also include a first gate contact 34A and a second gate contact 34B. The first gate contact 34A may contact the first common gate layer 18A, and the second gate contact 34B may contact the second common gate layer 18B. In some embodiments, the first gate contact 34A and the second gate contact 34B may be spaced apart from each other in the second horizontal direction Y and may be arranged along the second horizontal direction Y, as illustrated in FIGS. 11A and 11B. In some embodiments, the first gate contact 34A and the second gate contact 34B may be aligned along the second horizontal direction Y.

The 2-input NAND gate may include multiple via contacts 42. A first one of the via contacts 42 may contact the first gate contact 34A, a second one of the via contacts 42 may contact the second gate contact 34B, and a third one of the via contacts 42 may contact the connecting portion 32_1c of the first top contact layer 32_1. The first, second and third ones of the via contacts 42 may be spaced apart from each other in the second horizontal direction Y and may be arranged along the second horizontal direction Y, as illustrated in FIG. 11B. The first, second and third ones of the via contacts 42 may be aligned along the second horizontal direction Y. The 2-input NAND gate may include multiple conductive lines 44, and each of the conductive lines 44 may contact a respective one of the first, second and third ones of the via contacts 42.

Figure 13A:
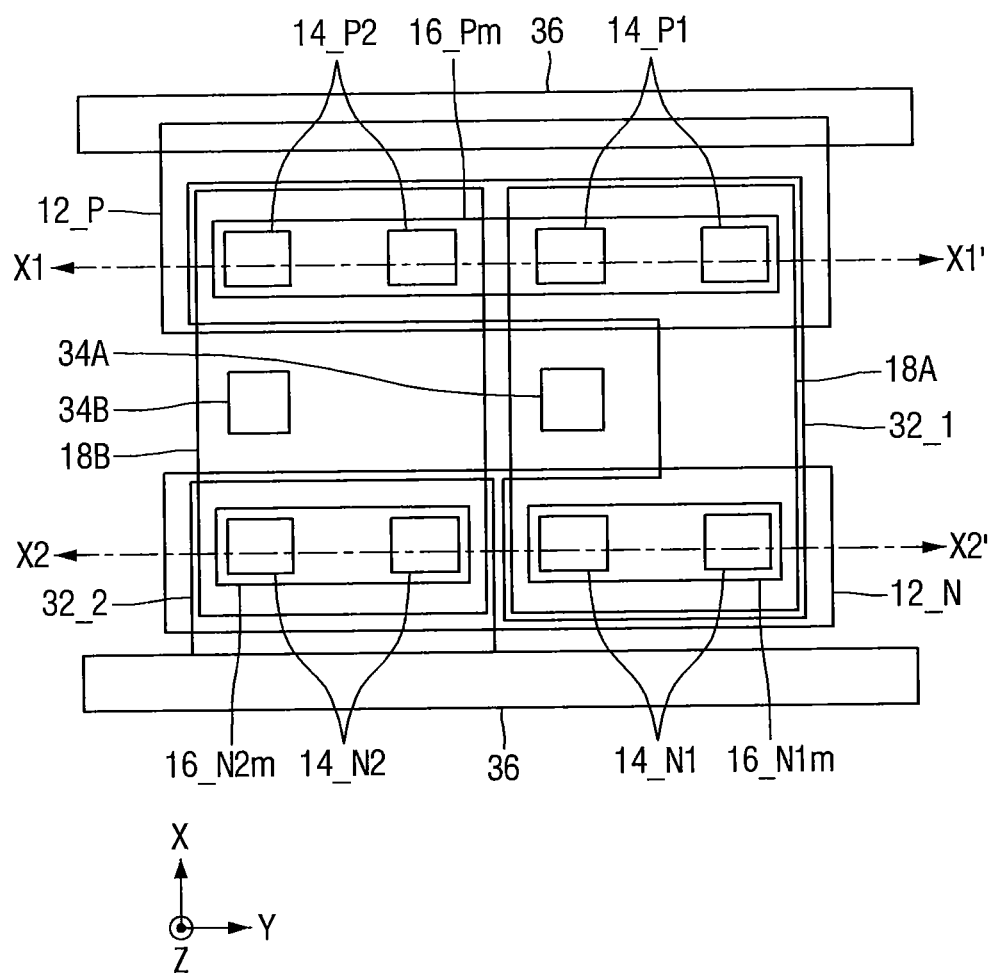
FIGS. 13A and 13B are layouts of the 2-input NAND gate of FIG. 10, according to some embodiments.
Figure 13B:
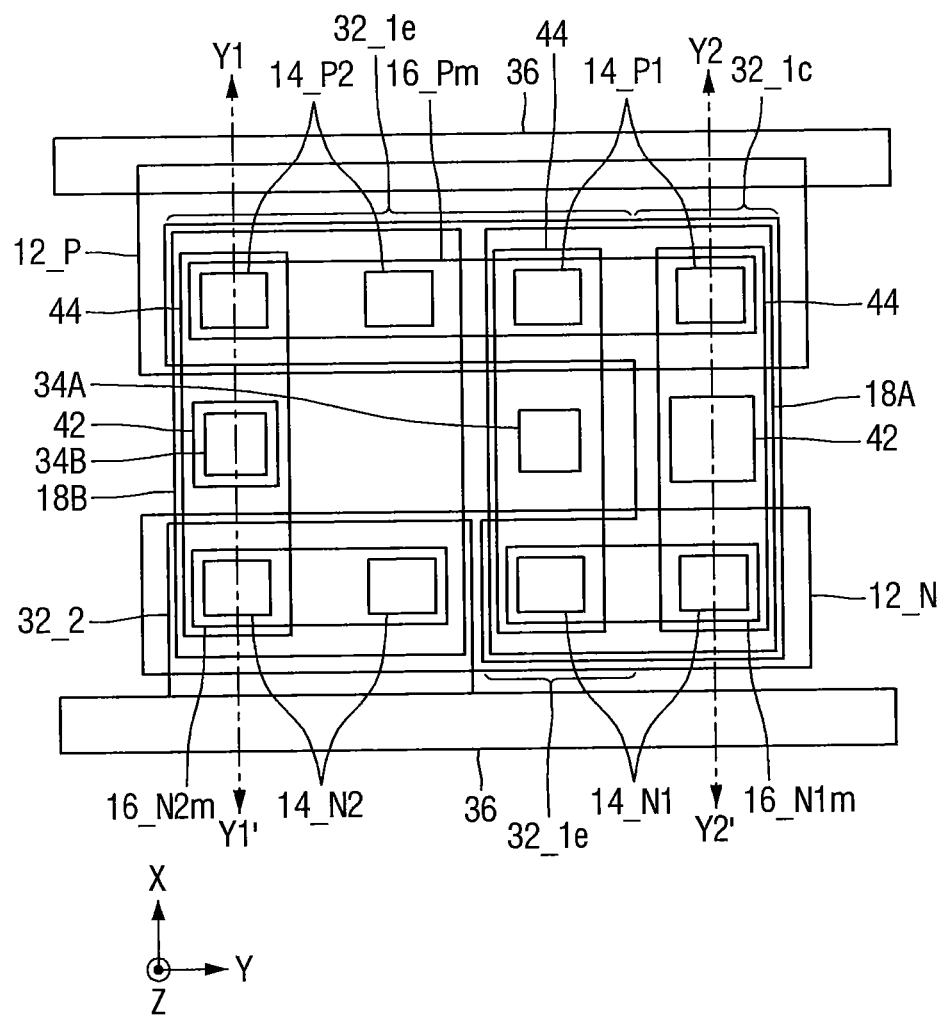

FIGS. 13A and 13B are layouts of the 2-input NAND gate of FIG. 10, according to some embodiments.

FIGS. 13A and 13B show the layouts of the same region of the 2-input NAND gate, and each of FIGS. 13A and 13B shows a group of elements, rather than all elements, to simplify drawings. FIGS. 13A and 13B do not show some elements (e.g., the first and second bottom source/drain regions 12_P and 12_N in FIG. 11A) shown in FIGS. 11A and 11B to simplify drawings.

Figure 14A:
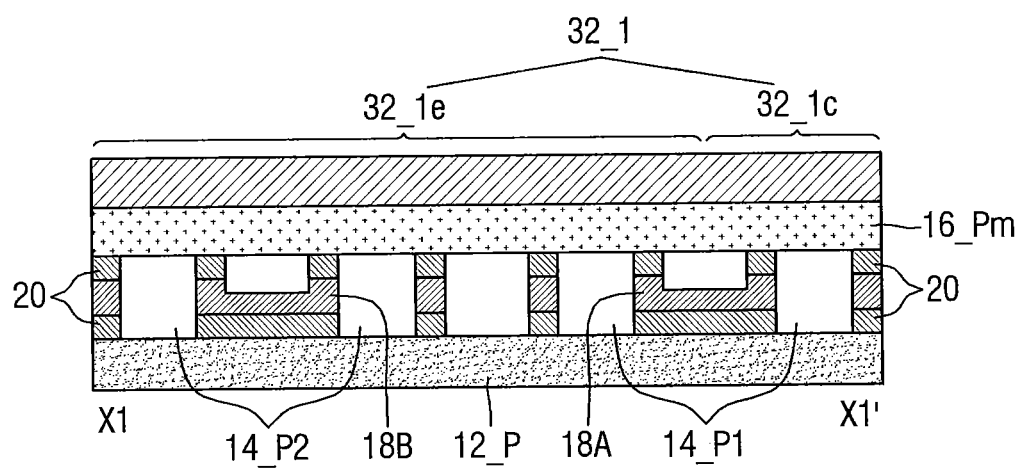
FIGS. 14A and 14B are cross-sectional views taken along the lines X1-X1' and X2-X2' of FIG. 13A, respectively.
Figure 14B:
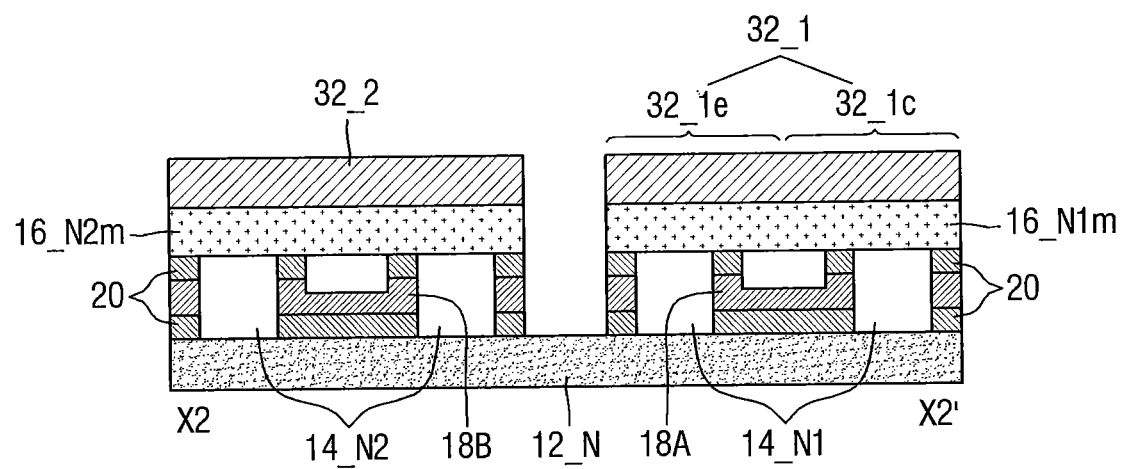

FIGS. 14A and 14B are cross-sectional views taken along the lines X1-X1' and X2-X2' of FIG. 13A, respectively.

Cross-sectional views taken along the lines Y1-Y1' and Y2-Y2' of FIG. 13B may be the same as or similar to FIGS. 12A and 12B, respectively. To simplify drawings, the substrate 100 is not shown in FIGS. 14A and 14B.

The 2-input NAND gate shown in FIGS. 13A through 14B is the same as or similar to the 2-input NAND gate shown in FIGS. 11A through 12D except that a first merged top source/drain region 16_Pm, a second merged top source/drain region 16_N1m, and a fourth merged top source/drain region 16_N2m are included. Referring to FIG. 14A, the first merged top source/drain region 16_Pm may contact the two first channel regions 14_P1 and the two third channel regions 14_P2. Referring to FIG. 14B, the second merged top source/drain region 16_N1m may contact the two second channel regions 14_N1, and the fourth merged top source/drain region 16_N2m may contact the two fourth channel regions 14_N2.

Figure 15A:
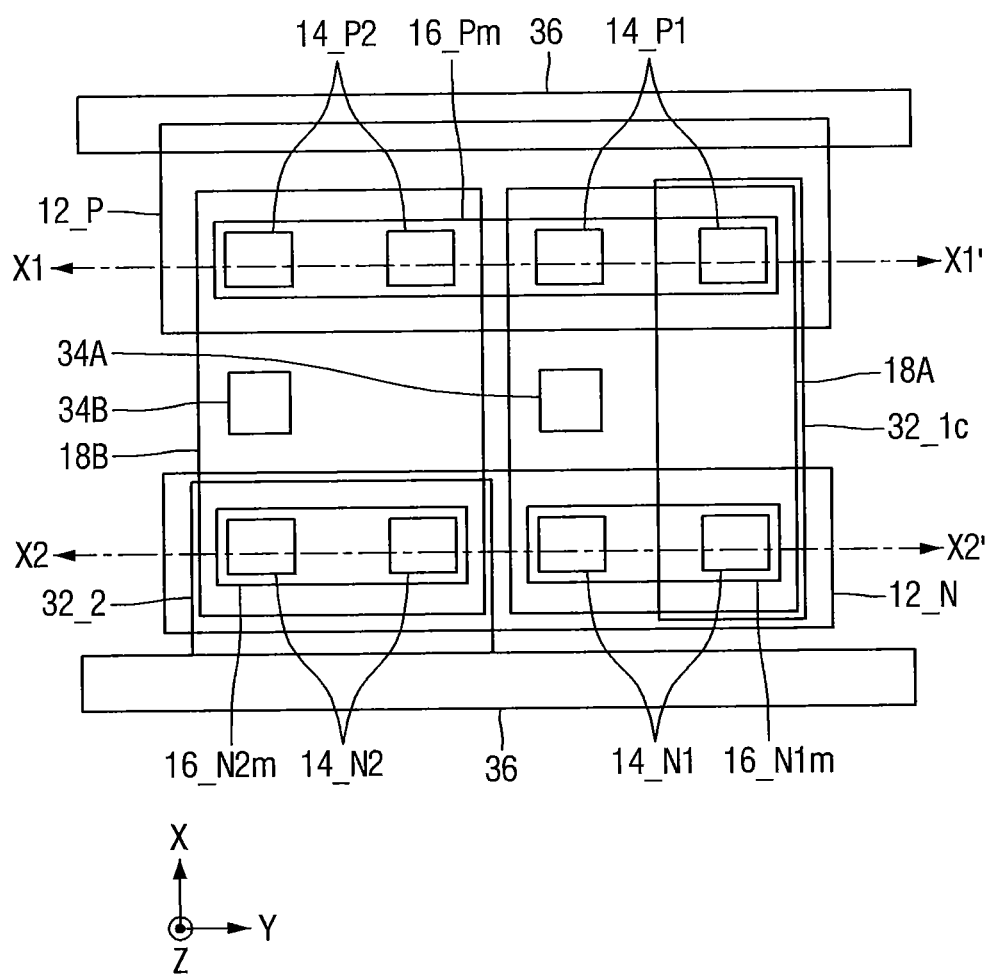
FIGS. 15A and 15B are layouts of the 2-input NAND gate of FIG. 10, according to some embodiments.
Figure 15B:
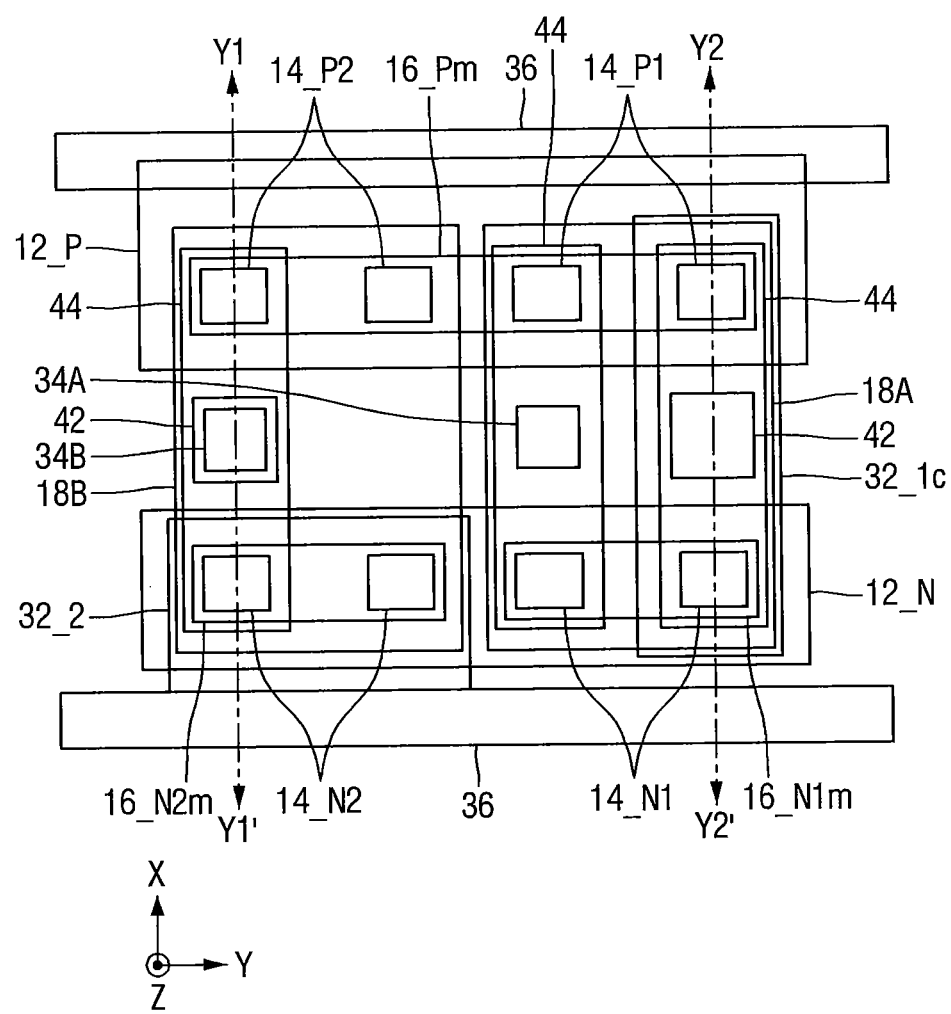

FIGS. 15A and 15B are layouts of the 2-input NAND gate of FIG. 10, according to some embodiments.

FIGS. 15A and 15B show the layouts of the same region of the 2-input NAND gate, and each of FIGS. 15A and 15B shows a group of elements, rather than all elements, to simplify drawings. FIGS. 15A and 15B do not show some elements (e.g., the first and second bottom source/drain regions 12_P and 12_N in FIG. 11A) shown in FIGS. 11A and 11B to simplify drawings.

Figure 16A:
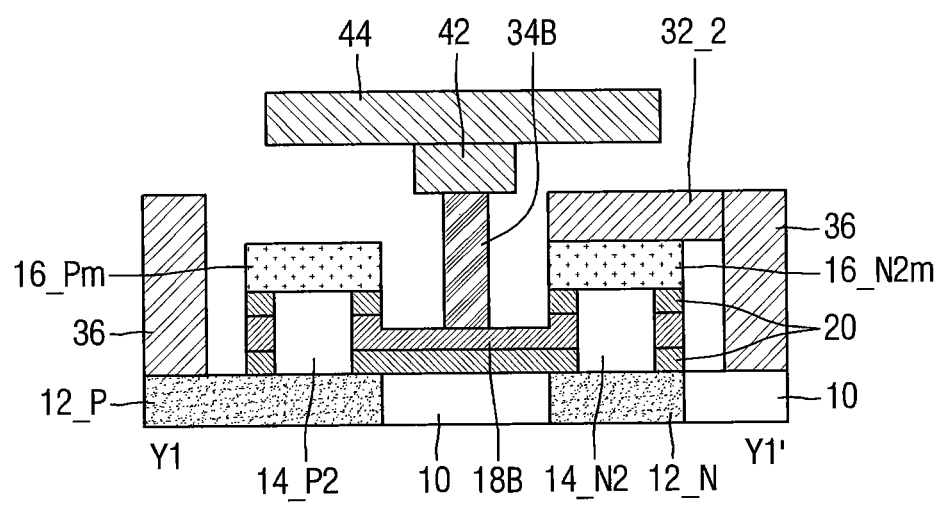
FIGS. 16A and 16B are cross-sectional views taken along the lines Y1-Y1' and Y2-Y2' of FIG. 15B, respectively.
Figure 16B:
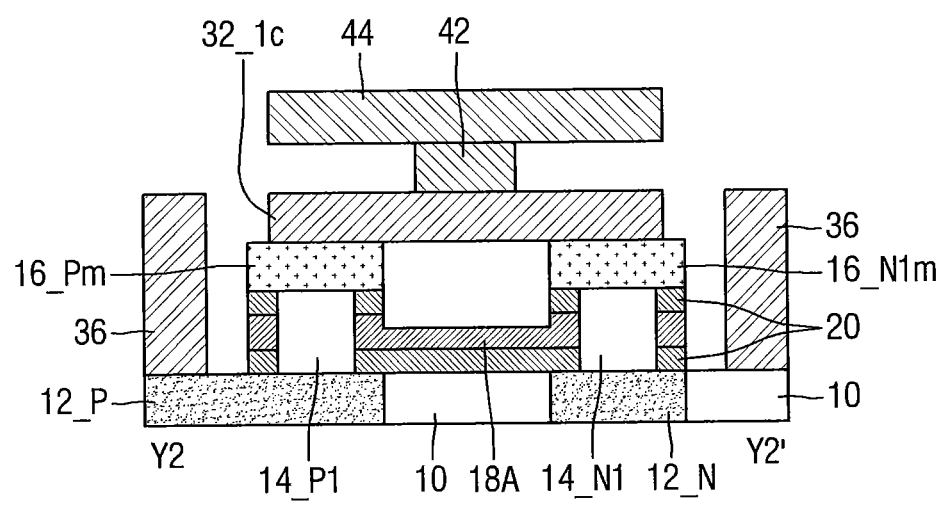
Figure 16C:
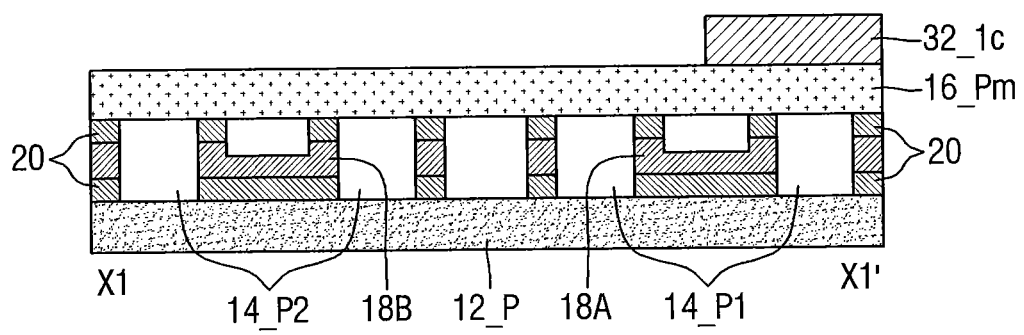
FIGS. 16C and 16D are cross-sectional views taken along the lines X1-X1' and X2-X2' of FIG. 15A, respectively, according to some embodiments.
Figure 16D:
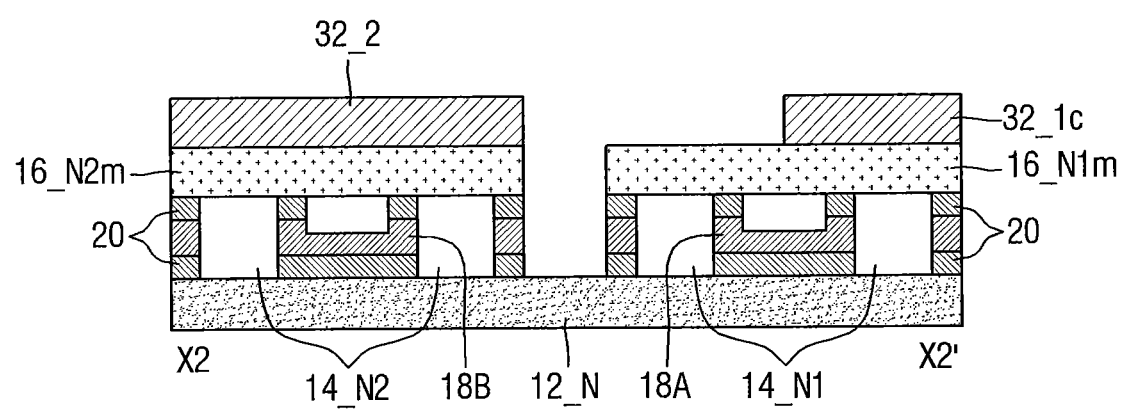

FIGS. 16A and 16B are cross-sectional views taken along the lines Y1-Y1' and Y2-Y2' of FIG. 15B, respectively, and FIGS. 16C and 16D are cross-sectional views taken along the lines X1-X1' and X2-X2' of FIG. 15A, respectively, according to some embodiments.

To simplify drawings, the substrate 100 is not shown in FIGS. 16A through 16D.

The 2-input NAND gate shown in FIGS. 15A through 16D is the same as or similar to the 2-input NAND gate shown in FIGS. 13A through 14B except the shape of the first top contact layer 32_1. In some embodiments, the first top contact layer 32_1 may not include extending portions (e.g., 32_1e in FIG. 11B) and may include only a connecting portion 32_1c.

Figure 17A:
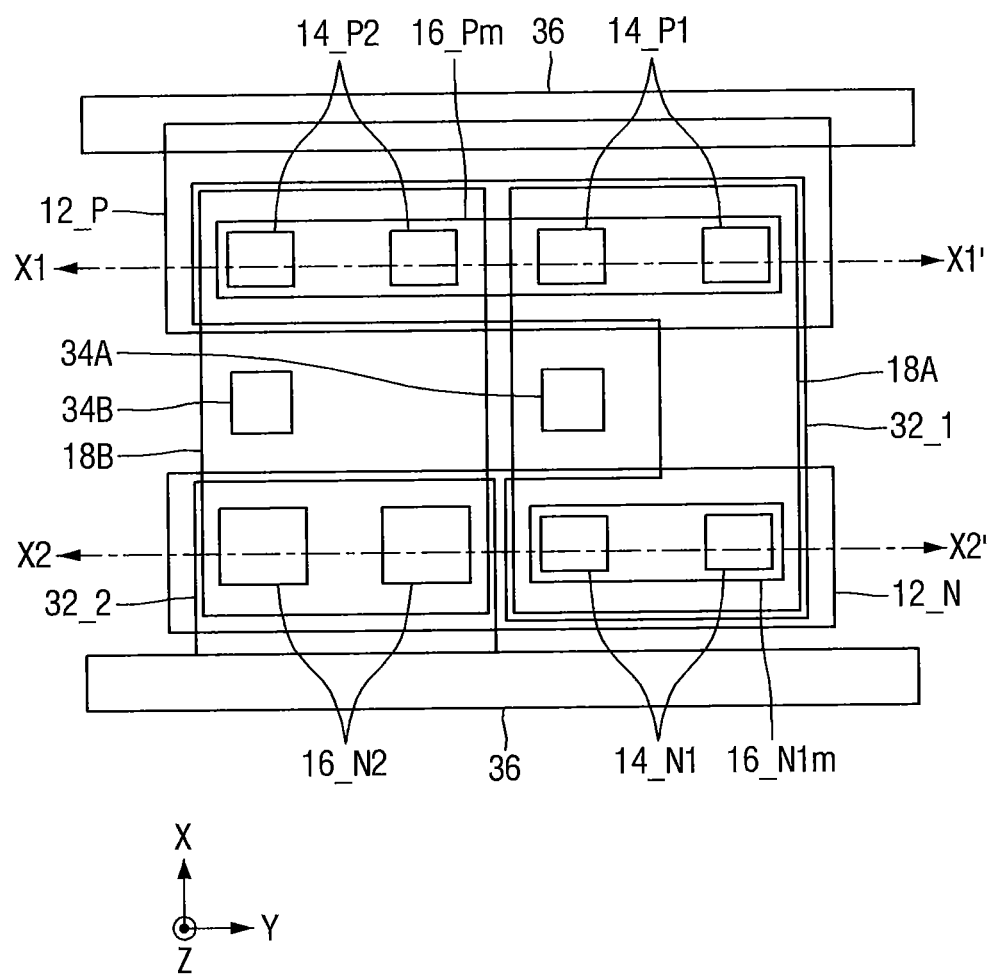
FIGS. 17A and 17B show layouts of the 2-input NAND gate of FIG. 10, according to some embodiments.
Figure 17B:
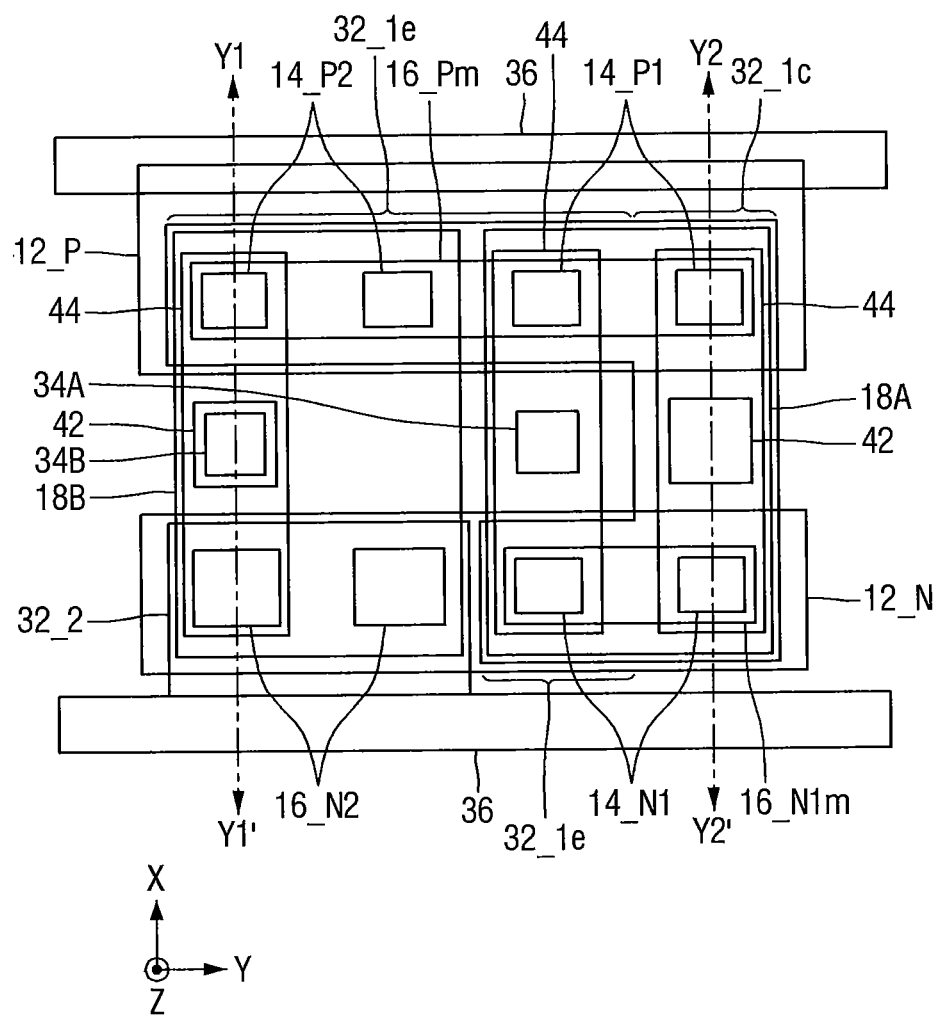

FIGS. 17A and 17B show layouts of the 2-input NAND gate of FIG. 10, according to some embodiments.

FIGS. 17A and 17B show the layouts of the same region of the 2-input NAND gate, and each of FIGS. 17A and 17B shows a group of elements, rather than all elements, to simplify drawings. FIGS. 17A and 17B do not show some elements (e.g., the first and second bottom source/drain regions 12_P and 12_N in FIG. 11A) shown in FIGS. 11A and 11B to simplify drawings.

Figure 18A:
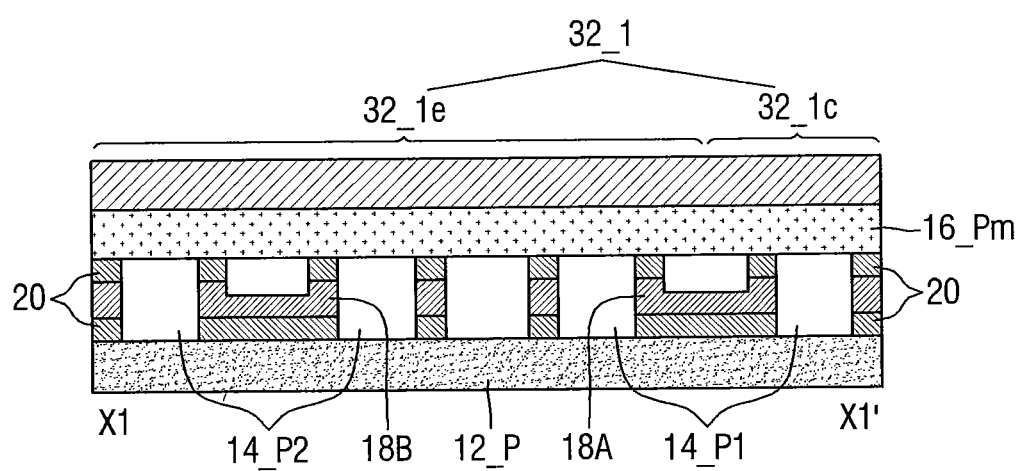
FIGS. 18A and 18B are cross-sectional views taken along the lines X1-X1' and X2-X2' of FIG. 17A, respectively.
Figure 18B:
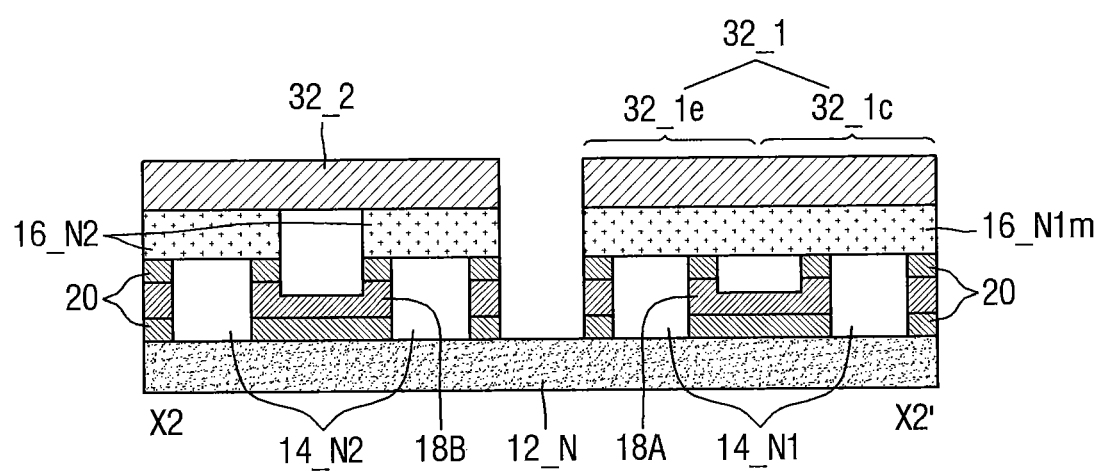

FIGS. 18A and 18B are cross-sectional views taken along the lines X1-X1' and X2-X2' of FIG. 17A, respectively.

Cross-sectional views taken along the lines Y1-Y1' and Y2-Y2' of FIG. 17B may be the same as or similar to FIGS. 12A and 12B, respectively, according to some embodiments. To simplify drawings, the substrate 100 is not shown in FIGS. 18A and 18B.

The 2-input NAND gate shown in FIGS. 17A through 18B is the same as or similar to the 2-input NAND gate shown in FIGS. 13A through 14B except the fourth top source/drain region 16_N2 that include two separate fourth top source/drain regions 16_N2.

Figure 19:
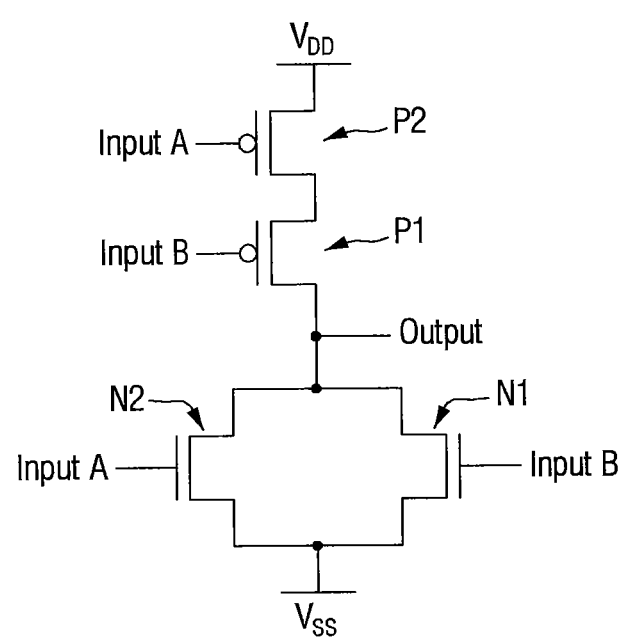
FIG. 19 is a circuit diagram of a 2-input NOR, according to some embodiments.

FIG. 19 is a circuit diagram of a 2-input NOR, according to some embodiments.

The 2-input NOR of FIG. 19 may include a first P-type VFET P1 and a first N-type VFET N1 connected the same as the circuit shown in FIG. 1. Specifically, the first P-type VFET P1 and the first N-type VFET N1 may share a first input (e.g., Input B) and an output (e.g., Output). The 2-input NOR may also include a second P-type VFET P2 and a second N-type VFET N2, which share a second input (e.g., Input A). The 2-input NOR shown in FIG. 19 is the same as the 2-input NAND gate shown in FIG. 10 except voltages (e.g., $V_{DD}$ and $V_{SS}$) applied to the second P-type VFET and the first and second N-type VFETs, and it will be understood that the 2-input NOR may have layouts and cross-sections the same as or similar to those shown in FIGS. 11A through 18B.

Figure 20:
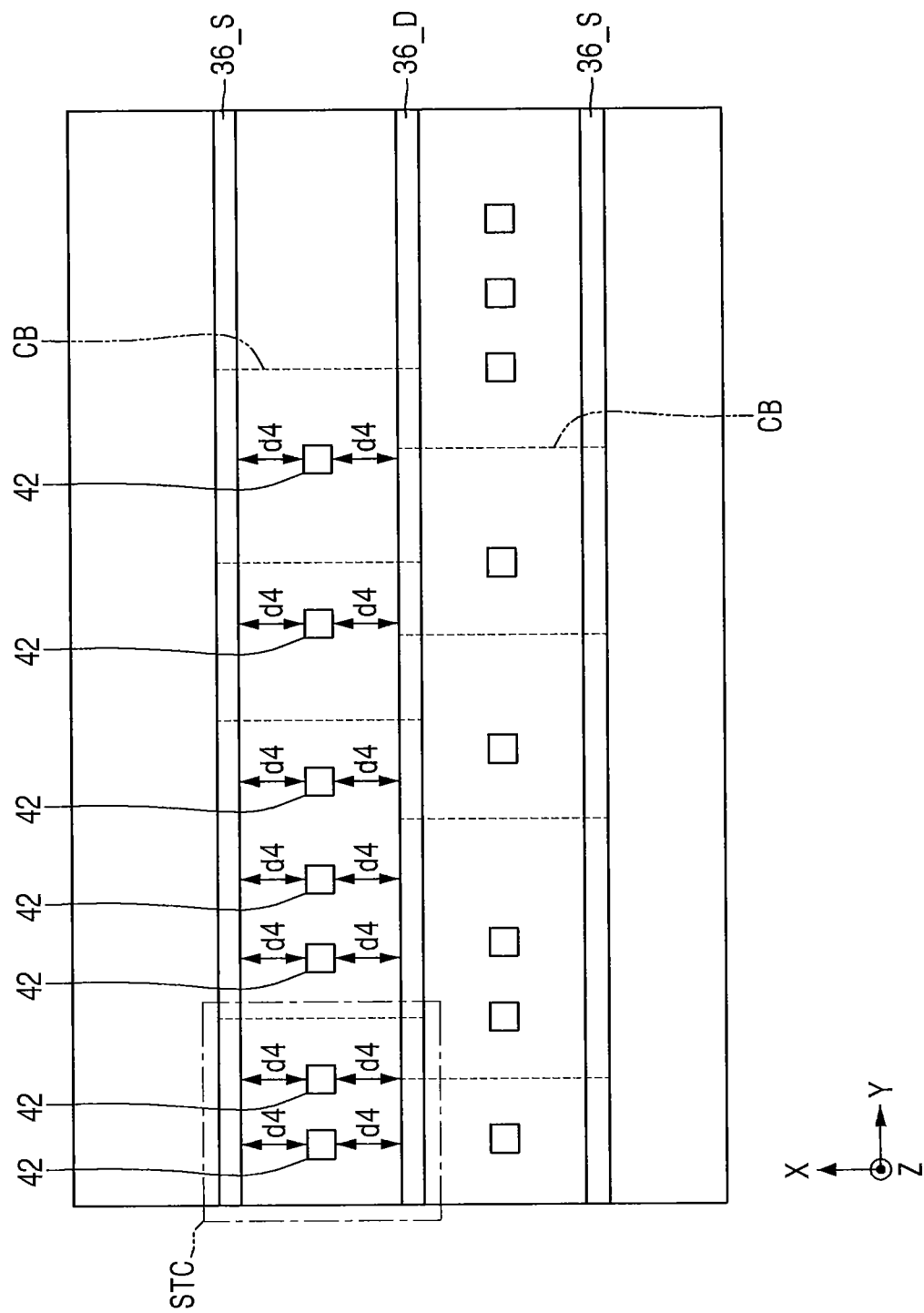
FIG. 20 shows a simplified layout of an integrated circuit device including multiple standard cells STCs, according to some embodiments of the present inventive concept.

FIG. 20 shows a simplified layout of an integrated circuit device including multiple standard cells STCs, according to some embodiments.

Referring to FIG. 20, the integrated circuit device may include multiple bottom contacts 36_S and 36_D. Bottom contacts 36_S connected to a source voltage $V_{SS}$ and bottom contacts 36_D connected to a drain voltage $V_{DD}$ may be alternately arranged along the first horizontal direction X. Each of the bottom contacts 36_S and 36_D may extend longitudinally in the second horizontal direction Y. A single standard cell STC may be defined by a pair of bottom contacts 36_S and 36_D and cell boundaries CB.

In some embodiments, the integrated circuit device may include multiple via contacts 42. Some standard cells STCs may include multiple via contacts 42 therein. Each of the via contacts 42 may contact a respective one of first metal lines (e.g., the conductive lines 44 in FIG. 6B), which are metal lines closest to a substrate in the vertical direction Z for routing. Each of the via contacts 42 may contact a respective one of gate contacts (e.g., 34 in FIG. 6A) and top contact layers (e.g., 32 in FIG. 6A).

In some embodiments, each of the via contacts 42 may be spaced apart from one of a pair of bottom contacts 36_S and 36_D in the first horizontal direction X by a fourth distance d4, as shown in FIG. 20. In some embodiments, via contacts 42 of the integrated circuit device may be spaced apart from each other in the second horizontal direction Y and may be arranged along the second horizontal direction Y, as shown in FIG. 20. In some embodiments, all of the via contacts 42 included in each of standard cells STCs may be spaced apart from each other in the second horizontal direction Y and may be arranged along the second horizontal direction Y, as shown in FIG. 20.

Figure 21:
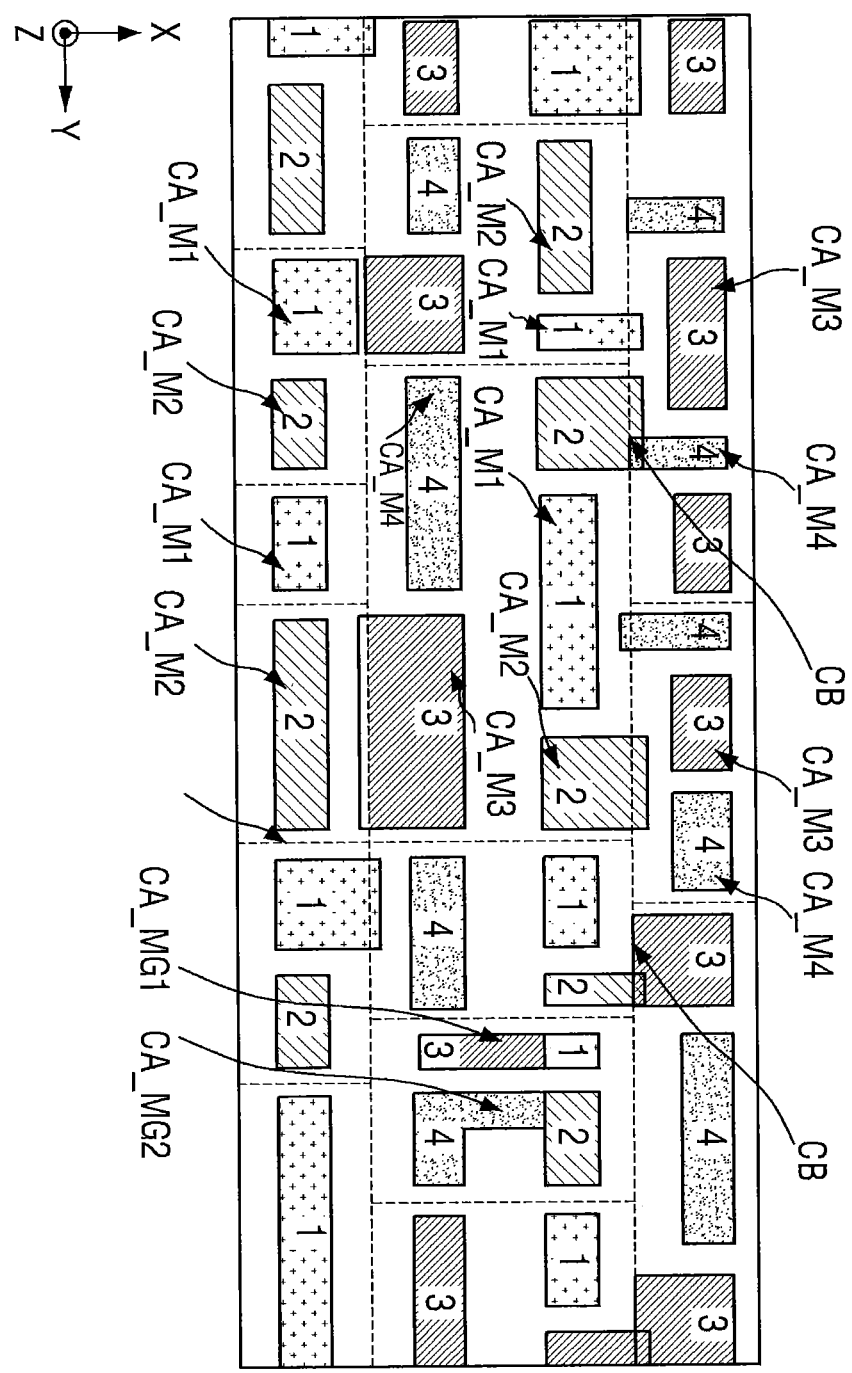
FIG. 21 shows a simplified layout of an integrated circuit device including multiple standard cells STCs, according to some embodiments.

FIG. 21 shows a simplified layout of an integrated circuit device including multiple standard cells STCs, according to some embodiments. As the integration density of integrated circuit devices increases, top contact layers (e.g., 32 in FIG. 3A) in adjacent standard cells STCs may have different sizes and may be disposed at different locations. Accordingly, forming those various top contact layers using a single photo mask may increase complexity of a process of forming those top contact layers, and a Multi Patterning Technique (MPT) using multiple photo masks may be used to simply the process.

Referring to FIG. 21, an integrated circuit device may include multiple standard cells STCs that are arranged in a first horizontal direction X and in a second horizontal direction Y and are separated by cell boundaries CB therebetween. A single standard cell STC may include multiple top contact layers among a first mask top contact layer CA_M1, a second mask top contact layer CA_M2, a third mask top contact layer CA_M3, and a fourth mask top contact layer CA_M4. The first mask top contact layer CA_M1 may be formed using a first photo mask, the second mask top contact layer CA_M2 may be formed using a second photo mask, the third mask top contact layer CA_M3 may be formed using a third photo mask, and the fourth mask top contact layer CA_M4 may be formed using a fourth photo mask. In some embodiments, the first mask top contact layers CA_M1 and the second mask top contact layers CA_M2 are arranged in an alternating sequence along the second horizontal direction Y, and the third mask top contact layers CA_M3 and the fourth mask top contact layers CA_M4 are arranged in an alternating sequence along the second horizontal direction Y, as illustrated in FIG. 21.

In some embodiments, a single top contact layer may be formed by merging or stitching two separate top contact layers spaced apart from each other in the first horizontal direction X. As illustrated in FIG. 21, a first merged top contact layer CA_MG1 may be formed by merging or stitching a first mask top contact layer CA_M1 and a third mask top contact layer CA_M3, and a second merged top contact layer CA_MG2 may be formed by merging or stitching a second mask top contact layer CA_M2 and a fourth mask top contact layer CA_M4.

Although FIG. 21 shows the integrated circuit device including four different mask top contact layers, it will be understood that more than four mask top contact layers may be formed in a single integrated circuit device.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A standard cell comprising:
   a P-type vertical field effect transistor (VFET) comprising a first channel region and a first top source/drain region sequentially stacked on a substrate in a vertical direction;
   an N-type VFET comprising a second channel region and a second top source/drain region sequentially stacked on the substrate in the vertical direction; and
   a top contact layer contacting both the first top source/drain region and the second top source/drain region,
   wherein the P-type VFET and the N-type VFET are spaced apart from each other in a first horizontal direction that is perpendicular to the vertical direction, and
   wherein the top contact layer comprises:
   a connecting portion extending in the first horizontal direction and being spaced apart from the P-type VFET and the N-type VFET in a second horizontal direction that traverses the first horizontal direction and is perpendicular to the vertical direction; and
   first and second extending portions protruding from the connecting portion of the top contact layer in the second horizontal direction toward the P-type VFET and the N-type VFET and contacting the first top source/drain region and the second top source/drain region, respectively.

2. The standard cell of claim 1, wherein the top contact layer is connected to an output node of the standard cell.

3. The standard cell of claim 1, further comprising a via contact and a conductive line that are sequentially stacked on the connecting portion of the top contact layer,
   wherein the via contact contacts the connecting portion of the top contact layer, and
   wherein the conductive line is electrically connected to the top contact layer through the via contact.

4. The standard cell of claim 3, wherein the connecting portion of the top contact layer comprises opposing sides that are spaced apart from each other in the first horizontal direction, and
   wherein the via contact is equidistant from each of the opposing sides of the connecting portion of the top contact layer.

5. The standard cell of claim 1, wherein the P-type VFET comprises a first P-type VFET, and the N-type VFET comprises a first N-type VFET, and
   wherein the standard cell further comprises:
   a second P-type VFET comprising a third channel region and a third top source/drain region sequentially stacked on the substrate in the vertical direction; and
   a second N-type VFET comprising a fourth channel region and a fourth top source/drain region sequentially stacked on the substrate in the vertical direction,
   wherein the connecting portion of the top contact layer contacts both the third top source/drain region and the fourth top source/drain region.

6. The standard cell of claim 5, further comprising a via contact and a conductive line that are sequentially stacked on the connecting portion of the top contact layer,
   wherein the via contact contacts the connecting portion of the top contact layer and is equidistant from the third channel region and the fourth channel region, and
   wherein the conductive line is electrically connected to the top contact layer through the via contact.

7. The standard cell of claim 5, further comprising a bottom source/drain region in the substrate, wherein a first portion of the bottom source/drain region comprises a first bottom source/drain region of the first P-type VFET, and a second portion of the bottom source/drain region comprises a second bottom source/drain region of the second P-type VFET.

8. The standard cell of claim 1, further comprising a common gate layer,
wherein a first portion of the common gate layer comprises a first gate electrode of the P-type VFET, and a second portion of the common gate layer comprises a second gate electrode of the N-type VFET.

9. The standard cell of claim 8,
further comprising first and second conductive lines on the common gate layer,
wherein the first and second conductive lines are spaced apart from each other in the second horizontal direction, and
wherein the top contact layer is electrically connected to the first conductive line, and the common gate layer is electrically connected to the second conductive line.

10. The standard cell of claim 9, further comprising:
a first via contact that is between the top contact layer and the first conductive line and electrically connects the top contact layer to the first conductive line; and
a second via contact that is between the common gate layer and the second conductive line and electrically connects the common gate layer to the second conductive line,
wherein the first via contact and the second via contact are spaced apart from each other in the second horizontal direction.

11. The standard cell of claim 10, wherein the second via contact is equidistant from the first channel region and the second channel region.

12. A standard cell comprising:
a P-type vertical field effect transistor (VFET) comprising a first channel region and a first top source/drain region sequentially stacked on a substrate in a vertical direction;
an N-type VFET comprising a second channel region and a second top source/drain region sequentially stacked on the substrate in the vertical direction; and
a top contact layer contacting both the first top source/drain region and the second top source/drain region,
wherein the P-type VFET and the N-type VFET are spaced apart from each other in a first horizontal direction that is perpendicular to the vertical direction,
wherein the first channel region comprises a pair of first channel regions spaced apart from each other in a second horizontal direction that traverses the first horizontal direction and is perpendicular to the vertical direction, and the first top source/drain region extends in the second horizontal direction and contacts the pair of first channel regions,
wherein the second channel region comprises a pair of second channel regions spaced apart from each other in the second horizontal direction, and the second top source/drain region extends in the second horizontal direction and contacts the pair of second channel regions, and
wherein the top contact layer is extended in the first horizontal direction and overlaps a first one of the pair of first channel regions and a first one of the pair of second channel regions.

13. The standard cell of claim 12, wherein the top contact layer does not overlap a second one of the pair of first channel regions and does not overlap a second one of the pair of second channel regions.

14. A standard cell comprising:
a P-type vertical field effect transistor (VFET) comprising a first channel region and a first top source/drain region sequentially stacked on a substrate in a vertical direction;
an N-type VFET comprising a second channel region and a second top source/drain region sequentially stacked on the substrate in the vertical direction, wherein the P-type VFET is spaced apart from the N-type VFET in a first horizontal direction that is perpendicular to the vertical direction;
a common gate layer comprising a first portion that comprises a first gate electrode of the P-type VFET and a second portion that comprises a second gate electrode of the N-type VFET;
first and second conductive lines on the common gate layer; and
first and second via contacts between the first and second conductive lines and the common gate layer,
wherein the first and second top source/drain regions are electrically connected to the first conductive line through the first via contact, and the common gate layer is electrically connected to the second conductive line through the second via contact, and
wherein the first via contact and the second via contact are spaced apart from each other in a second horizontal direction that is perpendicular to both the first horizontal direction and the vertical direction and are arranged along the second horizontal direction.

15. The standard cell of claim 14, wherein the second via contact is equidistant from the first channel region and the second channel region.

16. The standard cell of claim 14, further comprising a top contact layer contacting both the first top source/drain region and the second top source/drain region,
wherein the top contact layer comprises opposing sides spaced apart from each other in the first horizontal direction, and the first via contact is equidistant from each of the opposing sides of the top contact layer.

17. The standard cell of claim 14, wherein the first conductive line is connected to an output node of the standard cell.

18. The standard cell of claim 14, further comprising a contact plug between the common gate layer and the second via contact, and
wherein the contact plug is equidistant from the first channel region and the second channel region.

19. The standard cell of claim 14, wherein the P-type VFET comprises a first P-type VFET, and the N-type VFET comprises a first N-type VFET, and
wherein the standard cell further comprises:
a second P-type VFET comprising a third channel region and a third top source/drain region sequentially stacked on the substrate in the vertical direction; and
a second N-type VFET comprising a fourth channel region and a fourth top source/drain region sequentially stacked on the substrate in the vertical direction,
wherein third top source/drain and the fourth top source/drain region are electrically connected to the first conductive line through the first via contact.

20. The standard cell of claim 19, further comprising a bottom source/drain region in the substrate,
> wherein a first portion of the bottom source/drain region comprises a first bottom source/drain region of the first P-type VFET, and a second portion of the bottom source/drain region comprises a second bottom source/drain region of the second P-type VFET.

\* \* \* \* \*